(12) United States Patent
Fam et al.

(10) Patent No.: US 7,843,382 B2
(45) Date of Patent: Nov. 30, 2010

(54) MISMATCHED FILTER

(75) Inventors: Adly T. Fam, 1206 Charlesgate Cir., East Amherst, NY (US) 14051; Indranil Sarkar, Quincy, MA (US)

(73) Assignee: Adly T. Fam, East Amherst, NY (US)

( * ) Notice: Subject to any disclaimer, the term of this patent is extended or adjusted under 35 U.S.C. 154(b) by 27 days.

(21) Appl. No.: 12/335,214

(22) Filed: Dec. 15, 2008

(65) Prior Publication Data
US 2010/0149022 A1    Jun. 17, 2010

(51) Int. Cl.
*G01S 13/00* (2006.01)
(52) U.S. Cl. ........................ 342/175; 342/101
(58) Field of Classification Search ........... 342/159
See application file for complete search history.

(56) References Cited

U.S. PATENT DOCUMENTS

| | | | | |
|---|---|---|---|---|
| 5,070,337 A | * | 12/1991 | Chen et al. | 342/201 |
| 5,414,428 A | * | 5/1995 | Gallagher et al. | 342/132 |
| 6,363,107 B1 | * | 3/2002 | Scott | 375/150 |
| 2003/0198340 A1 | * | 10/2003 | Picciolo et al. | 379/406.01 |
| 2005/0228841 A1 | * | 10/2005 | Grobert | 708/422 |
| 2005/0242985 A1 | * | 11/2005 | Ponsford et al. | 342/59 |
| 2006/0072693 A1 | * | 4/2006 | Hui | 375/350 |

* cited by examiner

*Primary Examiner*—Thomas H Tarcza
*Assistant Examiner*—Timothy A Brainard

(57) ABSTRACT

The present solution provides methods and systems for realizing hardware efficient mismatched filters for pulse compression codes. For pulse compression codes with sufficiently small sidelobe structures, such as in the cases of odd length Barker codes, the proposed filters require a small number of adders and multipliers per output. This translates to significantly reduced chip-area and lower power consumption when implemented on a chip. In one aspect, the present application features a method for suppressing an undesired part of a waveform. The method includes filtering a signal via a filter. In one embodiment, the signal includes an expected waveform that can be represented as a sum of the desired part and the undesired part. The impulse response of the filter can be represented a sum of the desired part and a negative of the undesired part.

19 Claims, 16 Drawing Sheets

MISMATCHED FILTER

RELATED APPLICATION

This application incorporates by reference in its entirety: "Multiplicative Mismatched Filters for Optimum Range Sidelobe Suppression in Barker Code Reception," U.S. application Ser. No. 11/559,776, filed Nov. 14, 2006.

FIELD OF THE INVENTION

The present application is generally directed to methods and systems for sidelobe suppression in pulse compression codes.

BACKGROUND

Pulse compression codes are designed such that the transmitted energy is uniformly spread in time while the autocorrelation function (ACF) has most of its energy in the mainlobe. Upon matched filtering of such codes, the output is their ACF. The peak sidelobe level (PSL) in the ACF of any good code is required to be as low as possible. Barker codes have the least PSL (of unity magnitude) among all biphase codes. In most applications, it is desirable to reduce the sidelobes further. This is achieved via mismatched filters.

Mismatched filters for sidelobe suppression can be based on both Infinite Impulse Response (IIR) and Finite Impulse Response (FIR) filters. FIR mismatched filters can either be designed directly or as sidelobe suppression (SLS) filters in cascade with a matched filter. Length-optimal filters for sidelobe suppression produce the best possible sidelobe suppression for a given filter length. Since all their coefficients are optimized, length optimal filters are not hardware efficient.

SUMMARY OF THE INVENTION

The present solution provides methods and systems for realizing hardware efficient mismatched filters for pulse compression codes. For pulse compression codes with sufficiently small sidelobe structures, such as in the cases of odd length Barker codes, the proposed filters require a small number of adders and multipliers per output. This translates to significantly reduced chip-area and lower power consumption when implemented on a chip.

In one aspect, the present application features a method for suppressing an undesired part of a waveform. The method includes filtering a signal via a filter. In one embodiment, the signal includes an expected waveform that can be represented as a sum of the desired part and the undesired part. The impulse response of the filter can be represented a sum of the desired part and a negative of the undesired part.

In one embodiment, the signal is an output of a matched filter. In another embodiment, a mainlobe and a plurality of sidelobes at the output of the matched filter forms the desired and the undesired part, respectively. In yet another embodiment, the expected waveform is an autocorrelation function of a pulse compression code. In one embodiment, the desired part of the autocorrelation function is a mainlobe and the undesired part is a plurality of sidelobes.

In one embodiment, the pulse compression code is a biphase code. In another embodiment, the pulse compression code is a polyphase code. The pulse compression code may include a Barker code, a Huffman sequence or a compound Barker code. Huffman sequences may also be referred to as Huffman codes. Huffman sequences are examples of variable magnitude codes that are characterized by sidelobes of unity magnitude only at two extremes of its autocorrelation function.

In one embodiment, the method further includes realizing a set of discrete coefficients of the filter from the impulse response. In another embodiment, the filter includes a finite impulse response (FIR) filter. In another embodiment, the filter includes an infinite impulse response (IIR) filter. In still another embodiment, the filter may be a combination of an FIR and an IIR filter.

In another aspect, the present application features a system for suppressing an undesired part of an expected waveform. The system includes a filter whose impulse response can be represented as a sum of a desired part and a negative of an undesired part of an expected waveform. The expected waveform can be represented as a sum of the desired part and the undesired part.

In one embodiment, the system further includes a second filter that processes the output of the filter. In one embodiment, the second filter has an impulse response that can be represented as a sum of a second desired part and a negative of a second undesired part of a second expected waveform. In another embodiment, the second expected waveform can be represented as a sum of the second desired part and the second undesired part. In still another embodiment, the second expected waveform is the expected waveform processed by the filter.

In one embodiment, the filter is connected to an output of a matched filter. In another embodiment, the expected waveform is an autocorrelation function of a pulse compression code. In still another embodiment, the pulse compression code is a biphase code. In yet another embodiment, the pulse compression code is a polyphase code. In some embodiments, the pulse compression code is a Barker code, a Huffman sequence or a compound Barker code.

In one embodiment, one or more external multipliers are connected across the filter. In some embodiments, the filter includes one or more of a multiplier, a delay unit and an adder. The multiplier, delay unit and adders are hardware units used for fabricating electronic circuits including integrated circuits as apparent to one skilled in the art.

In still another aspect, the present application features a method of realizing a filter in a device. In one embodiment, the method includes representing a waveform expected at an input of a filter as a sum of a desired part and an undesired part. The method further includes defining an impulse response of the filter as a sum of the desired part and a negative of the undesired part and realizing a filter represented by the impulse response. In some embodiments, the method may include identifying a discrete set of filter coefficients from the impulse response.

BRIEF DESCRIPTION OF THE FIGURES

The foregoing and other objects, aspects, features, and advantages of the present application will become more apparent and better understood by referring to the following description taken in conjunction with the accompanying drawings, in which.

DETAILED DESCRIPTION

Figure 1:
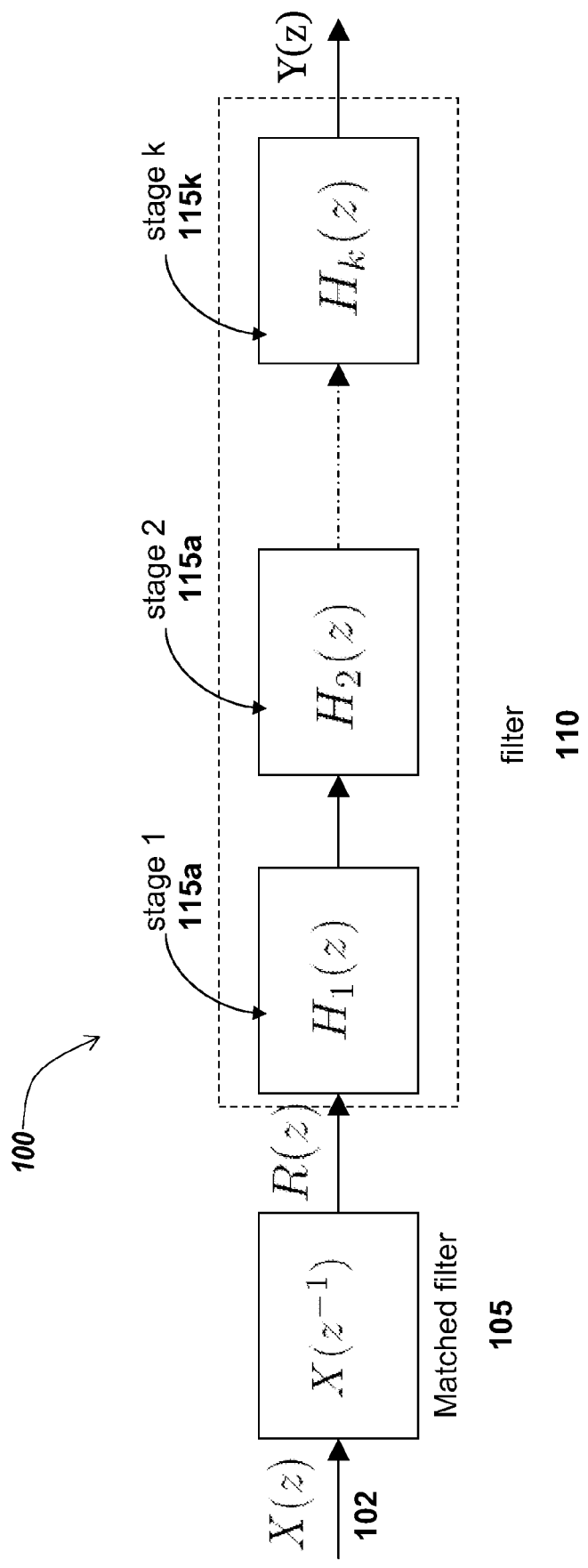
FIG. 1 is a block diagram of an embodiment of a system including a multistage mismatched filter in cascade with a matched filter.

Referring to FIG. 1, a block diagram of an embodiment of a system including a multistage mismatched filter in cascade with a matched filter is shown and described. In brief overview, the system 100 includes a matched filter 105. The system further includes a filter 110 In some embodiments, the filter 110 includes one or more filter stages 115a-115n (in general 115).

The system 100 may be implemented and operated on any type and form of electronic or computing device 101 (not shown). In one embodiment, the device 101 may be a computing device such as a desktop computer or a laptop computer. In another embodiment, the device 101 may be a microcomputer. In still another embodiment the device 101 may be a microcontroller. In yet another embodiment, the device 101 may be a digital signal processor (DSP) such as manufactured by Texas Instruments of Dallas, Tex. The device 101 and the system 100 may also be implemented on a software platform such as MATLAB or SIMULINK manufactured by MathWorks Inc. of Natick, Mass. In some embodiments, software simulating a microcomputer, microcontroller or a DSP may also be used to implement and execute the device 101. Examples of such software include MPLAB Integrated Development Environment developed by Microchip Technology Inc. of Chandler, Ariz. In one embodiment, the system 100 may be implemented on an integrated circuit. In another embodiment, the integrated circuit may be an application specific integrated circuit (ASIC). In still another embodiment, the system 100 may be implemented on a programmable chip such as a field programmable gate array (FPGA) via programming using any hardware description language (HDL). In some embodiments, the system 100 may be implemented as a combination of software and hardware as apparent to one skilled in the art. In another embodiment, the device 101 is implemented on a charge coupled device (CCD) or charge transfer device (CTD).

The device 101 may include any type and form of operating system. In some embodiments, the device 101 can be running any operating system such as any of the versions of the Microsoft® Windows operating systems, the different releases of the Unix and Linux operating systems, any version of the Mac OS® for Macintosh computers, any embedded operating system, any real-time operating system, any open source operating system, any proprietary operating system, any operating systems for mobile computing devices, or any other operating system capable of running on the device 101 and performing the operations described herein.

The device 101 may be a part of any system using a pulse compression code. In some embodiments, the device 101 may be a part of a radar system. In one of these embodiments, pulse compressed waveforms used in radar systems may require preprocessing before being fed to an input of the system 100. In other embodiments, the device 101 may be a part of an imaging system such as ultrasonic imaging, magnetic resonance imaging (MRI), computerized axial tomography (CAT) imaging or any other imaging as apparent to one skilled in the art. In still other embodiments, the device 101 can be a part of geophysical exploration systems, remote sensing systems, well logging electronics, seismological systems or any other systems employing pulse compression codes. In some embodiments, the methods and systems described herein may be used in optics applications such as inverse convolution for removing point-source distortion. In another embodiment, device 101 may be used in systems for correcting known channel distortions. In still another embodiment, the device 101 may be a part of an optical communication system using one or more of a laser source and a fiber optic channel. In yet another embodiment, the device 101 may be a part of a system using sonar waves.

An incoming signal 102 serves as an input to the system 100. In one embodiment, a signal is a physical quantity that carry information. In another embodiment, any quantity that varies over time and space can be taken as a signal. In still another embodiment, the signal may include electrical impulses or electromagnetic radiation. In some embodiments the signal can be discrete in nature. In some other embodiments, the signal may be continuous. A signal may also be one of an analog signal and a digital signal. In some embodiments, a signal may include a combination of a plurality of signal types. Examples of a signal may include but are not limited to voltage, current, electromagnetic waves, sound and light.

The incoming signal may include a waveform X(z) related to a pulse compression code. In FIG. 1 the waveform is represented in the z domain as X(z). It should be noted that the waveform can be expressed in any other form in other embodiments without deviating from the scope of the present application. In some embodiments, the pulse compression code is a biphase or binary code. Examples of biphase pulse compression codes include but are not limited to Barker codes, minimum peak sidelobe codes and compound Barker codes. In other embodiments, the pulse compression code can be a polyphase code including but not limited to polyphase or generalized Barker codes, Frank codes and P1-P4 codes generally denoted as Px codes. In some embodiments, the pulse compression code can be a variable magnitude code such as a Huffman sequence or Huffman code. Even though FIG. 1 represents an incoming signal simply as X(z), it should be apparent to one of ordinary skill in the art that in reality, the incoming signal may be corrupted by noise, interference and/or any other form of unwanted signals.

The incoming signal 102 is passed through a matched filter 105. The matched filter is matched to the pulse compression code being used in the system 100. In FIG. 1, the matched filter is represented in the z-domain purely for notational purposes and should not be considered limiting in any sense. The matched filter may be expressed in any other domain or form without deviating from the scope of the current application. The matched filter detects the presence of the waveform X(z) in the incoming signal 102. In some embodiments, the incoming signal 102 includes the pulse compressed waveform X(z) and the autocorrelation function R(z) is obtained at the matched filter output.

The matched filter transfer function, matched to the pulse compressed waveform X(z), is $X(z^{-1})$ and the matched filter output is the autocorrelation function waveform given by:

$$R(z)=X(z)X(z^{-1}) \qquad (1)$$

In the absence of any noise or other spurious signals, R(z) includes a mainlobe of height substantially equal to the length of the pulse compression code and a plurality of sidelobes. For notational purposes, we consider the autocorrelation function R(z) to be symmetric around the origin. The sidelobes are collectively denoted as S(z). It should be apparent to one of skill in the art that in practice, the system should be made causal by adding appropriate delays. R(z) is denoted by:

$$R(z)=N+S(z) \qquad (2)$$

It should be appreciated that in the presence of noise or other spurious signals, R(z) will also include components attributable to the noise and other spurious signals. However, in this example, R(z) can be considered to be an expected waveform at the input of the filter. The waveform R(z) can be represented as a sum of a part representing the mainlobe and a part representing the plurality of sidelobes. In some embodiments, the part associated with the mainlobe is a desired part of the response while the part representing the plurality of sidelobes is the undesired part of the waveform. In such embodiments, it is of interest to suppress the undesired part associated with the sidelobes and enhance the desired part, i.e. the mainlobe.

The system 100 includes a filter 110. The output of the matched filter, which may include the waveform R(z), is connected to the input of the filter 110. The filter 110 includes one or more filter stages 115. The transfer function of the first stage 115a of the filter 110 is given by:

$$H_1(z)=N-S(z) \qquad (3)$$

In some embodiments, the transfer function may also be referred to as an impulse response. In one embodiment, the first stage 115a of the filter 110 is implemented as an FIR filter. In other embodiments, the first stage 115a of the filter 110 may include an IIR filter. Examples of such embodiments will be described in more details with respect to FIGS. 2A and 2B. In some embodiments, the output of the first stage 115a of the filter 110 is connected to the input of the second stage 115b. In other embodiments, the filter 110 comprises only one stage 115a and the output of the first stage is the output Y(z) of the filter 100.

Although FIG. 1 depicts a plurality of stages 115a-115k of the filter 110, it should be appreciated that the filter 110 may comprise any number of stages. The expected input waveform at the nth stage of the filter 110 will be the expected waveform at the filter input R(z) processed by (n−1) preceding stages 115 where n>2. As shown in greater details below, in some embodiments, the expected waveform at the input of each stage can be represented as a sum of a desired part and an undesired part.

In the example where R(z) is the expected waveform at the input of the filter 100 and the plurality of sidelobes S(z) are the undesired part, the output of the first stage is given by:

$$Y_1(z) = [N + S(z)] \times [N - S(z)] \qquad (4)$$
$$= N^2 - [S(z)]^2 \qquad (5)$$

When the undesired sidelobes are sufficiently small compared to the desired part, the first stage of the filter increases the ratio of the peak magnitude of the desired part and the undesired part. In case of pulse compression codes a metric for measuring the ratio of these peak magnitudes is the mainlobe to peak sidelobe ratio (MSR).

Figure 2A:
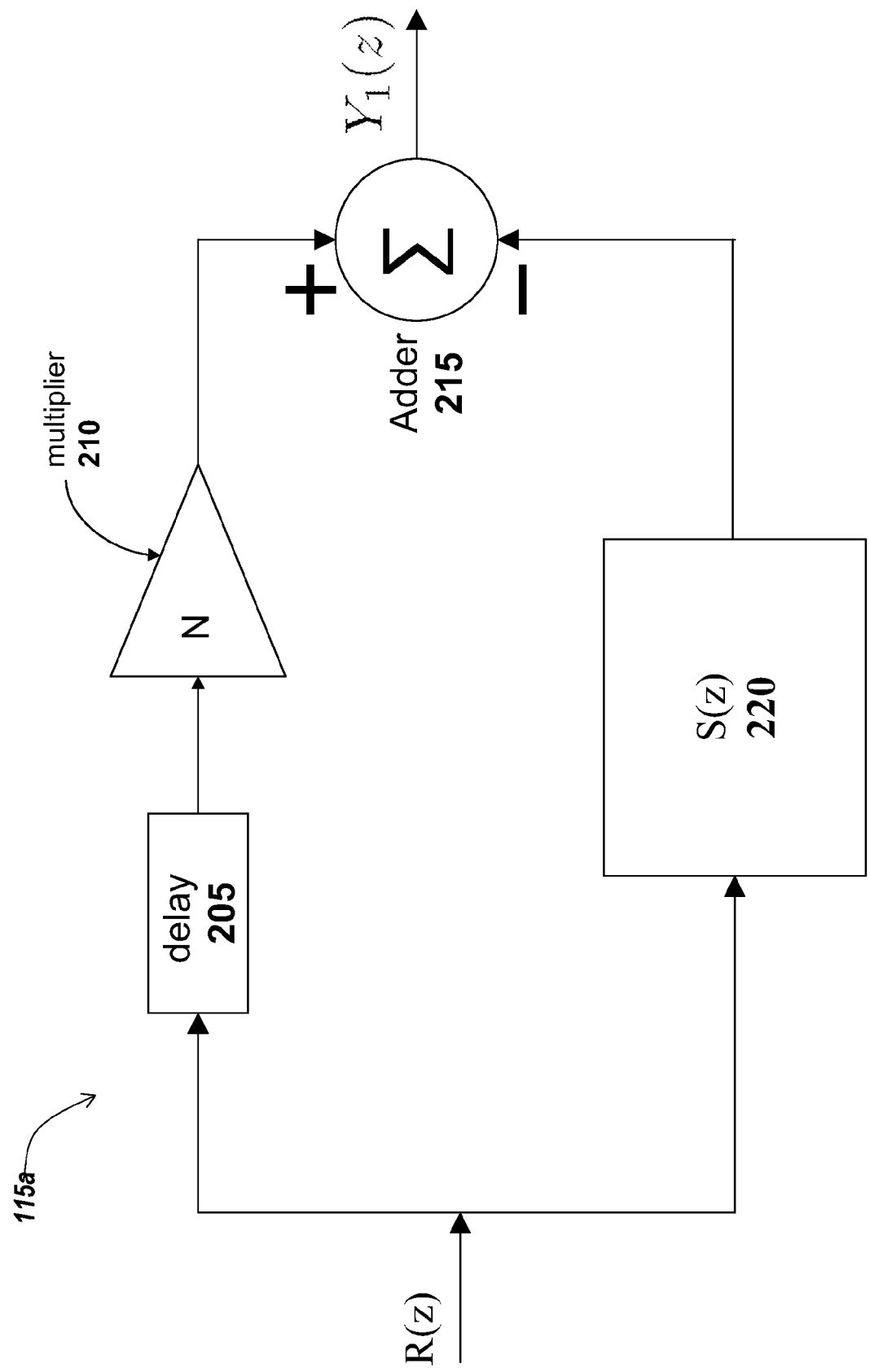
FIG. 2A is a block diagram depicting an example embodiment of a first stage of a filter in accordance with the methods and systems described herein.

Referring now to FIG. 2A, a block diagram depicting an example embodiment of the first stage 115a of the filter 110 is shown and described. In one embodiment, the first stage 115a includes a multiplier 210 representing the mainlobe of the expected waveform R(z). In some embodiments, the first stage 115a further includes a filter 220 whose impulse response represents the undesired plurality of sidelobes of the expected waveform R(z). Since the overall impulse response of the first stage 115a represents a sum of the desired part and the undesired part, in some embodiments the first stage 115a includes an adder 215 to compute the sum of the mainlobe and a negative of the plurality of sidelobes. In other embodiments, the first stage 115a includes one or more delay units 205. In one embodiment, the one or more delay units 205 are used to ensure causality. In another embodiment, the number of delay units depends on the position of the mainlobe with respect to the plurality of sidelobes.

If further sidelobe suppression is desired, output of the first stage 115a is connected to an input of the second stage 115b. In some embodiments, the output of the first stage $Y_1(z)$ can be represented as a sum of a desired part and an undesired part. From the example in equation (5), the desired part can be identified to be $N^2$ while the undesired part is $\{-S(z)^2\}$. The transfer function of the second stage 115b of the filter 110 for this example is therefore given by:

$$H_2(z)=N^2+[S(z)]^2 \qquad (6)$$

Figure 2B:
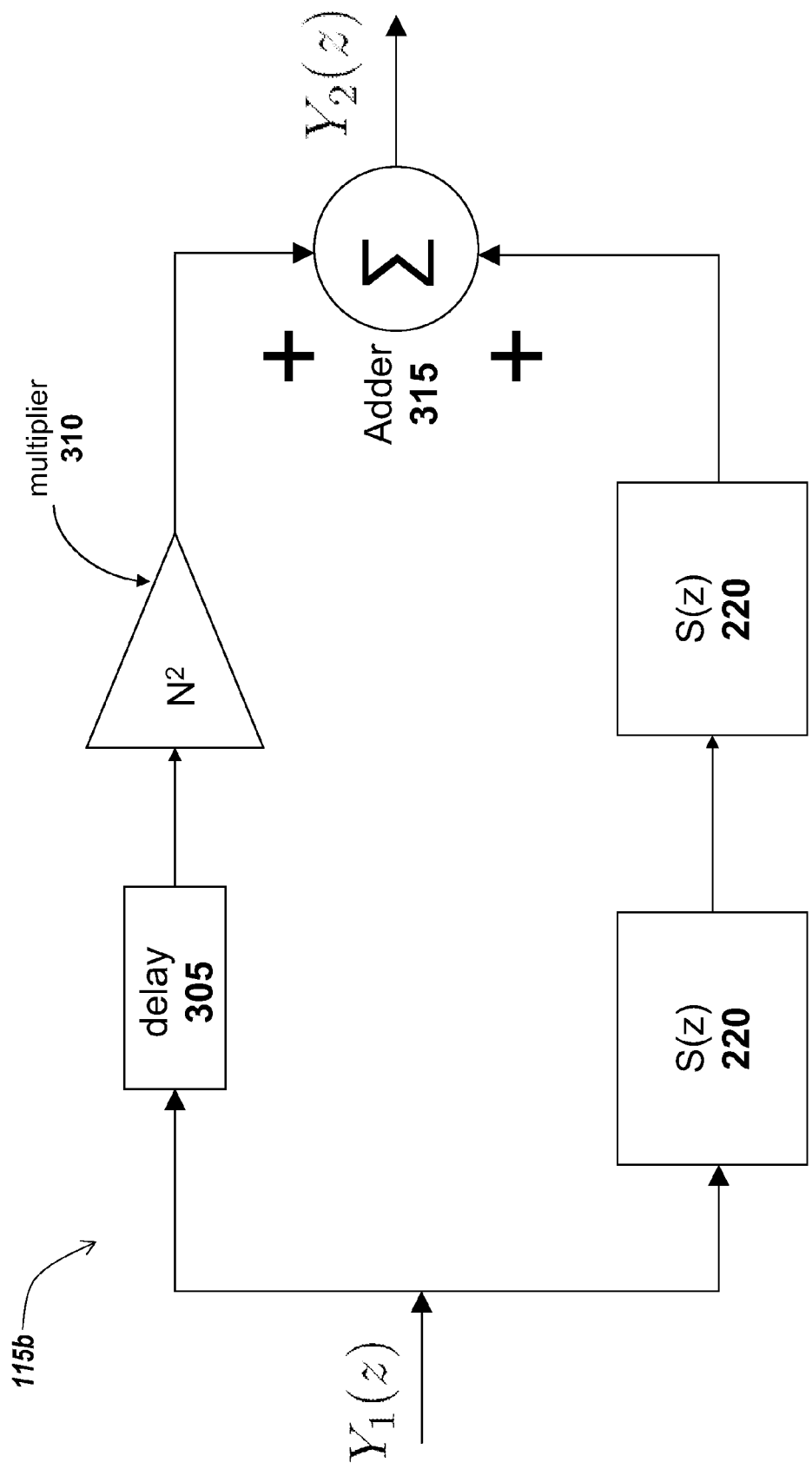
FIG. 2B is a block diagram depicting an example embodiment of a second stage of the filter.

Referring now to FIG. 2B, an example embodiment of the second stage 115b of the filter 110 is depicted. In one embodiment, the second stage includes a multiplier 310 representing a magnitude of the desired part of the input waveform ($N^2$ in this case). In some embodiments, the second stage 115b includes one or more filters 220 such that the overall impulse response of the one or more filters represents the undesired part of the input. The second stage 115b may also include one or more delay units 305 and an one or more adder 315.

Figure 2C:
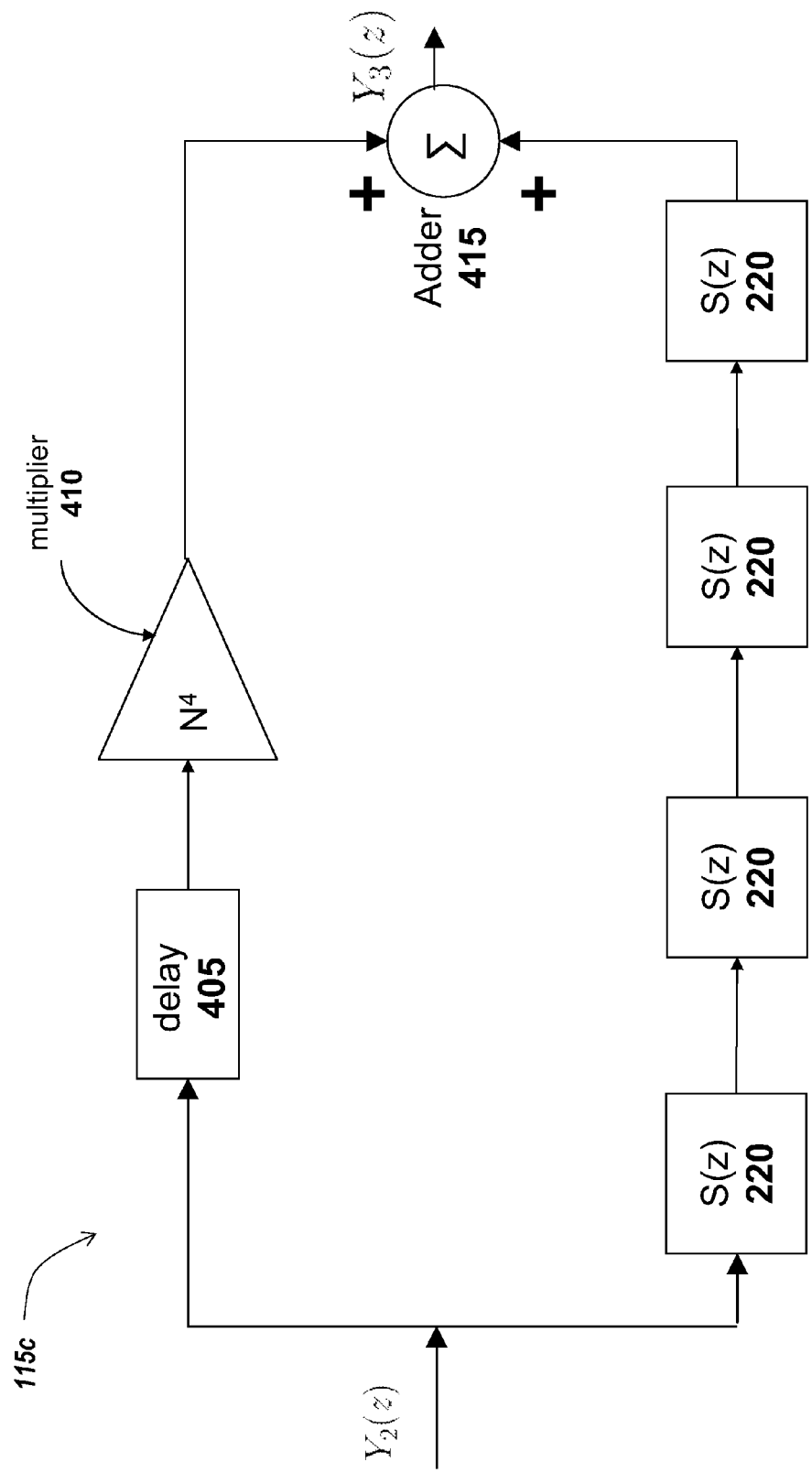
FIG. 2C is a block diagram depicting an example embodiment of a third stage of the filter.

In one embodiment, the output of the second stage 115b is taken as the output Y(z) of the filter 110. In other embodiments, the output $Y_2(z)$ of the second stage 115b is connected to an input of a third stage 115c. An example embodiment of the third stage 115c is depicted in FIG. 2C. The desired part of the input waveform for the third stage 115c is $N^4$ while the undesired part is $\{-S(z)^4\}$. In some embodiments, more number of stages 115 of the filter 110 can be implemented to achieve a predetermined level of suppression of the undesired part of the waveform. If k stages are used, the transfer function of the kth stage is given by:

$$H_k(z)=N^{2^{k-1}}+[S(z)]^{2^{k-1}} \qquad (7)$$

for k=2, 3, . . . . The output of the kth stage is given by:

$$Y_k(z)=N^{2^k}-[S(z)]^{2^k} \qquad (8)$$

In some embodiments, the expected waveform needs to satisfy certain conditions in order for the filter 110 to function satisfactorily. It should be understood that the favorable conditions described herein are not limiting in any sense and does not exclude other favorable conditions that may be derived under different assumptions. In some embodiments, the filter 110 may function even when the favorable conditions are not met exactly. In other embodiments, one stage of the filter 110 may not meet these favorable conditions while one or more other stages meet them.

Favorable Conditions

Consider the output of the first stage 115a of the filter 110 given by equation (5). In the time domain, the output is given by:

$$y_1(n) = N^2\delta(n) - [s(n) * s(n)] \quad (9)$$

where s(n) denotes the sidelobes of the autocorrelation function in the time domain.

In some embodiments, in order for the first stage 115a of a filter to work satisfactorily, the mainlobe to peak sidelobe ratio (MSR) at the output should be higher than the MSR of the input waveform. Let the peak sidelobe magnitude of the autocorrelation function be denoted by $\hat{s}$. Therefore, a condition for the filter 110 to work is given by:

$$\frac{N^2 - \sum |s(n)|^2}{\max_{(n>0)} |s(n) * s(n)|} > \frac{N}{\hat{s}} \quad (10)$$

For subsequent stages of the filter, the MSR at the output should be higher than the MSR at the input for that stage.

For Barker codes, since the peak sidelobe magnitude is unity, the condition for the first stage becomes:

$$\frac{N^2 - \sum |s(n)|^2}{\max_{(n>0)} |s(n) * s(n)|} > \frac{N}{1} \quad (11)$$

The condition is satisfied for Barker codes of length 3, 4, 5, 7, 11 and 13 as shown in table 1.

Therefore, for Barker codes, the MSR is improved at the output of the first stage 115a of the filter 110. Filters for Barker codes are discussed next with examples of filters for the important cases of length 13 and 11.

TABLE 1

MSR at the output of first stage for Barker codes

| Length of Barker Code (N) | $\Sigma \|s(n)\|^2$ | $\max_{(n>0)}\|s(n) * s(n)\|$ | MSR at output |
|---|---|---|---|
| 3 | 2 | 1 | 7 |
| 4 | 4 | 2 | 6 |
| 5 | 4 | 2 | 10.5 |
| 7 | 6 | 4 | 10.75 |
| 11 | 10 | 8 | 13.875 |
| 13 | 12 | 10 | 15.7 |

Filters for Barker Codes

An example implementation of the filter 100 is shown below using the example of a Barker code of length 13. The use of the Barker code of length 13 is used purely for illustrative purposes and should not be considered limiting in any sense. The autocorrelation function of a Barker code of length 13 is given by:

$$R_{13}(z) = 13 + (z^{12} + z^{10} + \ldots + z^2 + z^{-2} + \ldots + z^{-10} + z^{-12}) \quad (12)$$

In one embodiment, the first stage 115a of the filter 100 for the Barker code of length 13 is implemented as:

$$H_1(z) = 13 - (z^{12} + z^{10} + \ldots + z^2 + z^{-2} + \ldots + z^{-10} + z^{-12}) \quad (13)$$

In another embodiment, the first stage 115a may also be represented as follows:

$$H_1(z) = 13 - \{(z^{12} + z^{10} + \ldots + z^2 + 1 + z^{-2} + \ldots + z^{-10} + z^{-12}) - 1\} \quad (14)$$

$$= 14 - z^{12}(1 + z^{-2} + z^{-4} + \ldots + z^{-12} + z^{-14} + \ldots + z^{-24}) \quad (15)$$

$$= 14 - \frac{z^{12}(1 - z^{-26})}{(1 - z^{-2})} \quad (16)$$

Figure 3A:
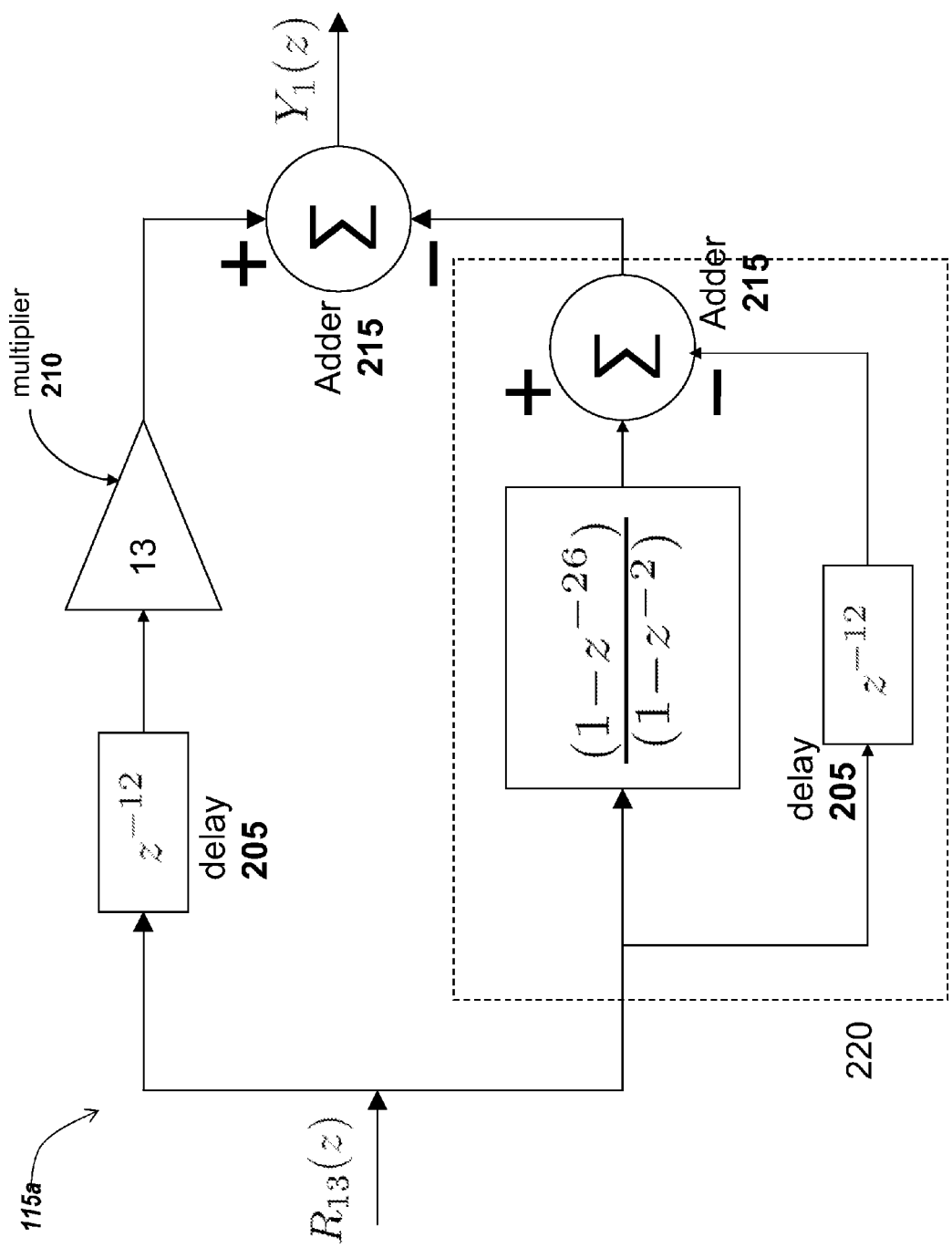
FIG. 3A is an example of the first stage of a filter for a Barker code of length 13.

In one embodiment, the first stage 115a for a Barker code of length 13 is implemented as represented in equation (14). A block diagram of such an embodiment is shown in FIG. 3A. In one embodiment, the filter 220 in this example may be implemented as a recursive running sum filter or any other form of IIR filter as shown in FIG. 3A. In another embodiment, the filter 220 may include one or more delay element 205. In still another embodiment, the filter 220 may include one or more adder 215. The filter structure of FIG. 3A depicts an example embodiment. In practice, the first stage 115a for a filter 100 for a Barker code may be implemented in any other form or structure as apparent to one skilled in the art.

Figure 3B:
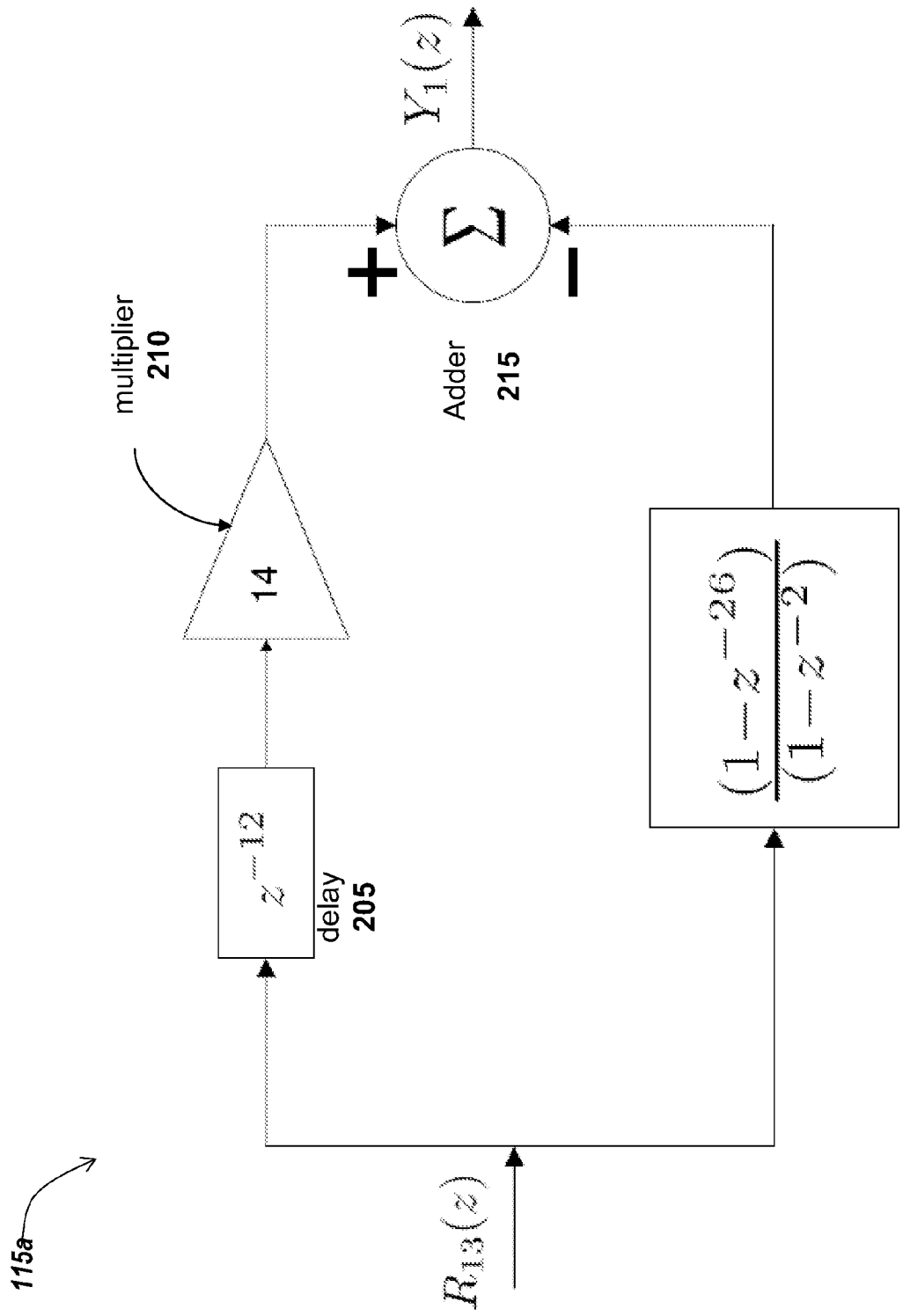
FIG. 3B is an alternative example of the first stage of the filter for a Barker code of length 13.

In some embodiments, a filter structure of the first stage 115a may be modified as a design choice. For example, the one or more delay units 205 inside and outside the filter 220 may be shared to make the filter structure more hardware efficient. In one embodiment, such modification may affect a value of the multiplier 210. FIG. 3B depicts a block diagram of such an embodiment. The design modifications depicted in FIG. 3B are expressed in equations (15) and (16). It should be noted that such design modifications can result in using less hardware. For example, the design modifications, as depicted in FIG. 3B, result in a decreased number of adders 215 and/or delay units 205. It can be seen from FIG. 3B that 3 adders and 1 multiplier are required to implement this embodiment of the first stage 115a. In other embodiments, the value of the multiplier (14 in this case), can be represented in terms of powers of 2 as ($2^4 - 2$). Thus, the multiplier can be replaced by one equivalent adder and two shifts. This means that the first stage 115a may be implemented without any multipliers and using only 4 adders. In applications where multipliers are significantly more expensive to implement than adders, this alternative offers further reduction in implementation cost.

Figure 3C:
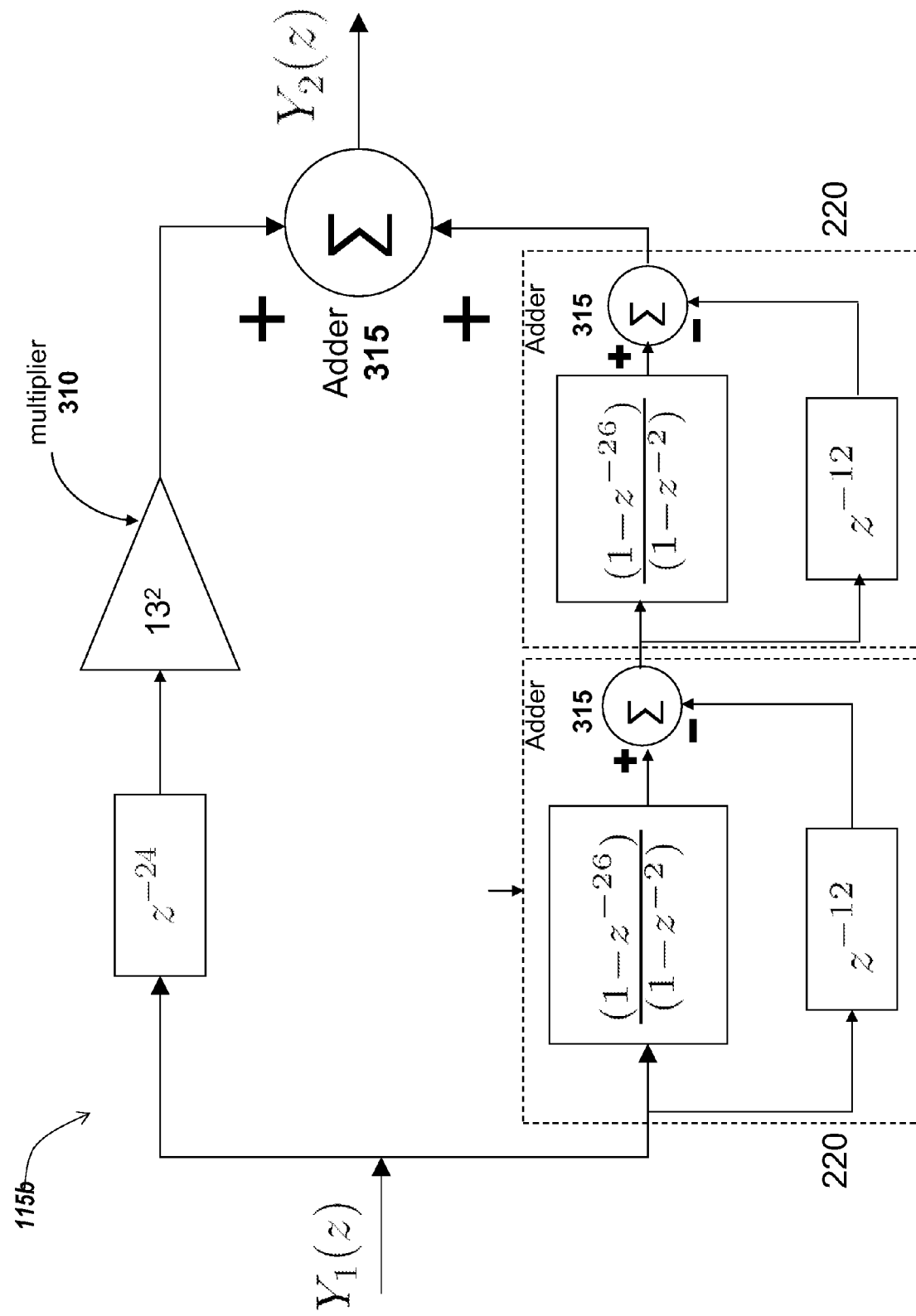
FIG. 3C is an example of the second stage of a filter for a Barker code of length 13.

Referring now to FIG. 3C, a second stage 115b of the filter 100 is shown. The second stage 115b of the filter 100 can be implemented as:

$$H_2(z) = N^2 + [S(z)]^2 \quad (17)$$

$$= 13^2 + \left[\frac{z^{12}(1 - z^{-26})}{(1 - z^{-2})} - 1\right]\left[\frac{z^{12}(1 - z^{-26})}{(1 - z^{-2})} - 1\right] \quad (18)$$

It should be noted that the (−1) term associated with the series of sidelobes in equation (14) is adjusted as a part of the mainlobe in equation (15). In some embodiments, this is avoided second stage onwards, in order to preserve the computational advantage of the filter. In some embodiments, the second stage 115b of the filter 100 for a length 13 Barker code is implemented as given by equation (18) and shown in FIG. 3C. For higher levels of sidelobe suppression, additional stages in the mismatched filters may be implemented following equation (7). As an example, the third stage 115c of the filter 110 for the length 13 Barker code is given by:

$$H_3(z) = N^4 + [S(z)]^4 \quad (19)$$

$$= 13^4 + \left[\frac{z^{12}(1-z^{-26})}{(1-z^{-2})} - 1\right]^4 \quad (20)$$

Figure 3D:
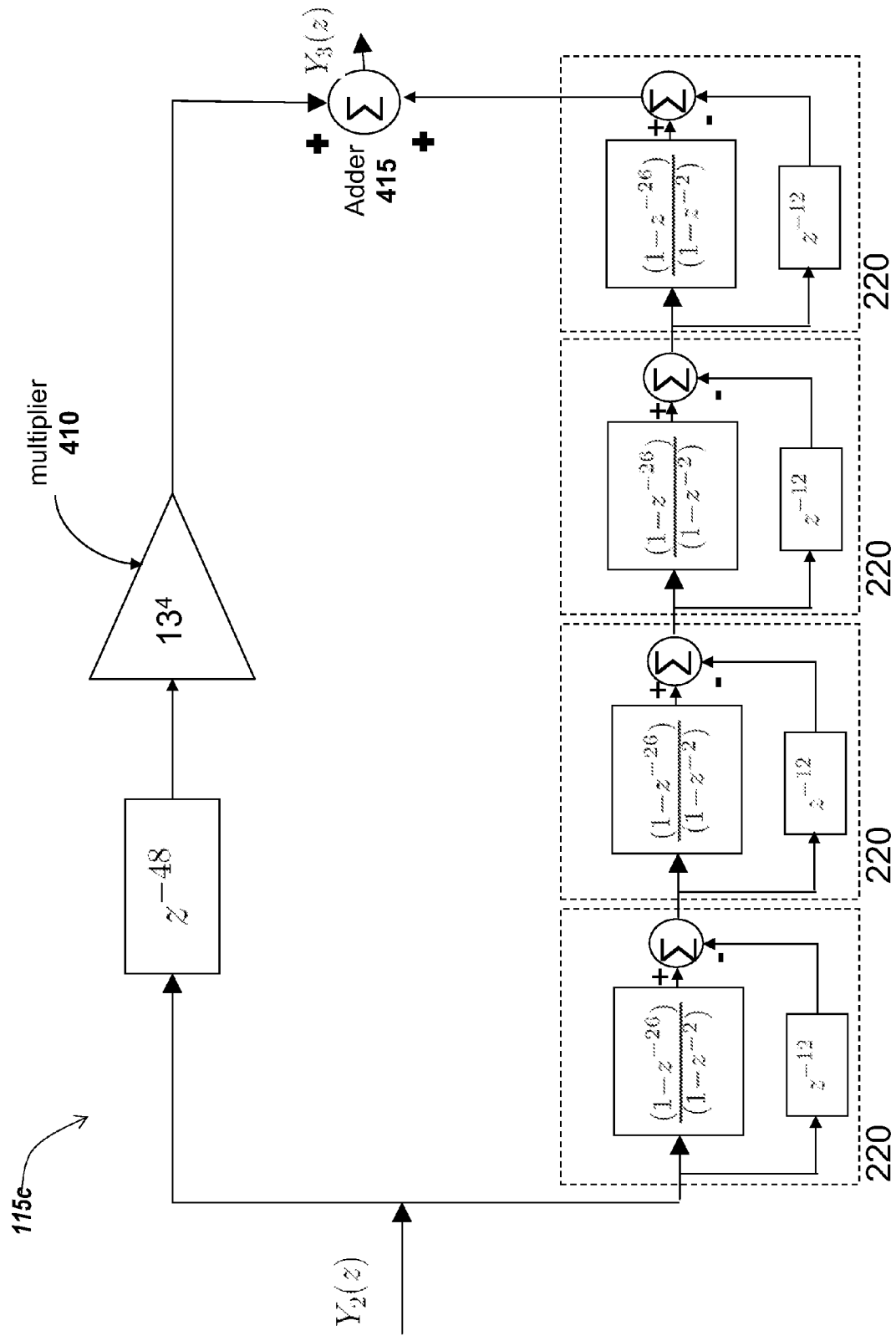
FIG. 3D is an example of the third stage of a filter for a Barker code of length 13.

The corresponding filter structure is shown in FIG. 3D.

In some embodiments, the multipliers used in one or more of the stages 115 can be represented by equivalent adders to reduce the computational complexity and hardware requirements. Table 2 shows examples how the multipliers in the different stages of the filters 110 for Barker codes of length 13 and 11 may be replaced by a small number of adders.

TABLE 2

Schemes to replace multipliers in different stages with equivalent adders

| | Multiplier | Equivalent representation | No. of adders |
|---|---|---|---|
| Filter for $b_{13}$ | | | |
| Stage 1 | 14 | $2^4 - 2$ | 1 |
| Stage 2 | $13^2$ | $2^7 + 2^5 + 2^3 + 2^0$ | 3 |
| Stage 3 | $13^4$ | $2^{15} - 2^{12} - 2^7 + 2^4 + 2^0$ | 4 |
| Filter for $b_{11}$ | | | |
| Stage 1 | 10 | $2^3 + 2$ | 1 |
| Stage 2 | $11^2$ | $2^7 - 2^3 + 2^0$ | 2 |
| Stage 3 | $11^4$ | $(2^7 - 2^3 + 2^0)(2^7 - 2^3 + 2^0)$ | 4 |

In one embodiment, the filter 110 and any adder, multiplier, delay unit or other hardware included as a part thereof may be implemented via fixed point implementation (viz. 2's complement). In other embodiments, floating point implementation may be used. In some embodiments, random errors due to ionization, interference etc. may affect the system performance. If such factors are expected and/or floating point implementation is used, then the filter may be implemented as one or more FIR filters and/or by using the concept of switching and resetting as presented in: T. Saramaki and A. T. Fam, *"Properties and structures of linear-phase FIR filters based on switching and resetting of IIR filters,"* IEEE International Symposium on Circuits and Systems, Vol. 4, pp. 3271-3274, May 1990.

Figure 4A:
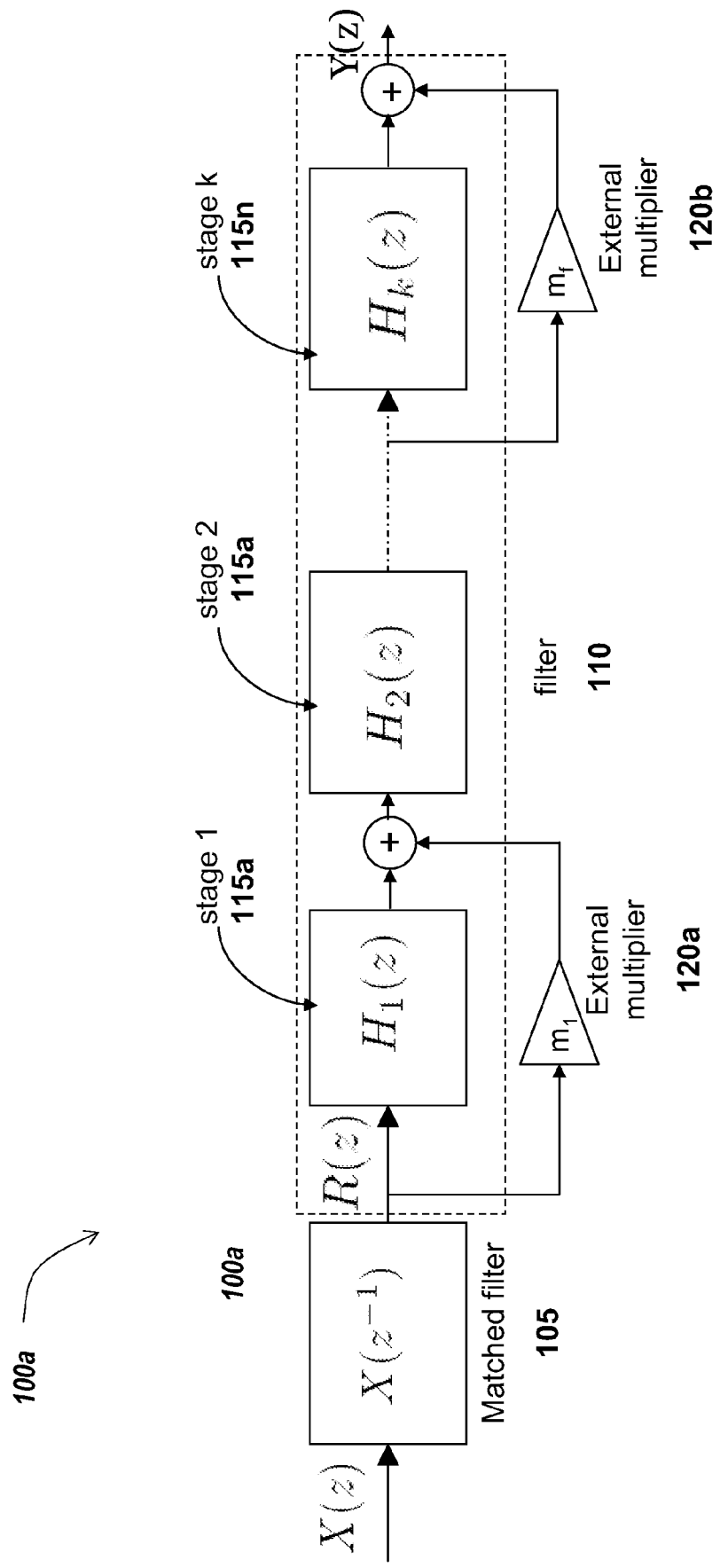
FIG. 4A is a block diagram of an embodiment of a multi-stage mismatched filter with external multipliers connected across some stages.

In some embodiments, performance of the filter 110 may be improved using additional hardware. In one embodiment, one or more multipliers may be connected across one or more stages 115 of the filter 110. In another embodiment, values for the one or more multipliers may be optimized for any cost function. In still another embodiment, the values of the one or more multipliers may be optimized for a best MSR performance for a given filter structure. An example embodiment 100a of such a filter structure is depicted in FIG. 4A. In one embodiment, an external multiplier $m_1$ 120a is connected across the first stage 115a. In some embodiments, the filter 110 performs well when the sidelobes of the preceding stage output is lower than a certain degree. Therefore, in these embodiments, a logical method to improve the performance of the filter is to produce considerably low sidelobes at the output of the first stage 115a. After that the performance of the filter 110 improves significantly for the subsequent stages.

Therefore, connecting an external multiplier 120a across the first stage 115a to have an improved MSR at the input of the second stage thus is advantageous for the performance of the subsequent stages 115b. It should be appreciated that one or more multipliers and/or other hardware that improves the filter performance may be used across any stage 115. However, addition of multipliers and/or other hardware in any stage increases the computational burden on the subsequent stages. The effects that a multiplier across the first stage 115a has on the filter structures of subsequent stages are discussed next with respect to FIGS. 4B-4D. It should be apparent to one of ordinary skill in the art that introduction of multipliers and/or other hardware across other stages 115 would further complicate the filter structures and should be done judiciously. In some embodiments, an external multiplier 120b may be connected across the last stage 115n to improve the performance of the filter 110. Obviously, the multiplier 120b across the last stage 115n adds insignificant computational and hardware burden.

Figure 4B:
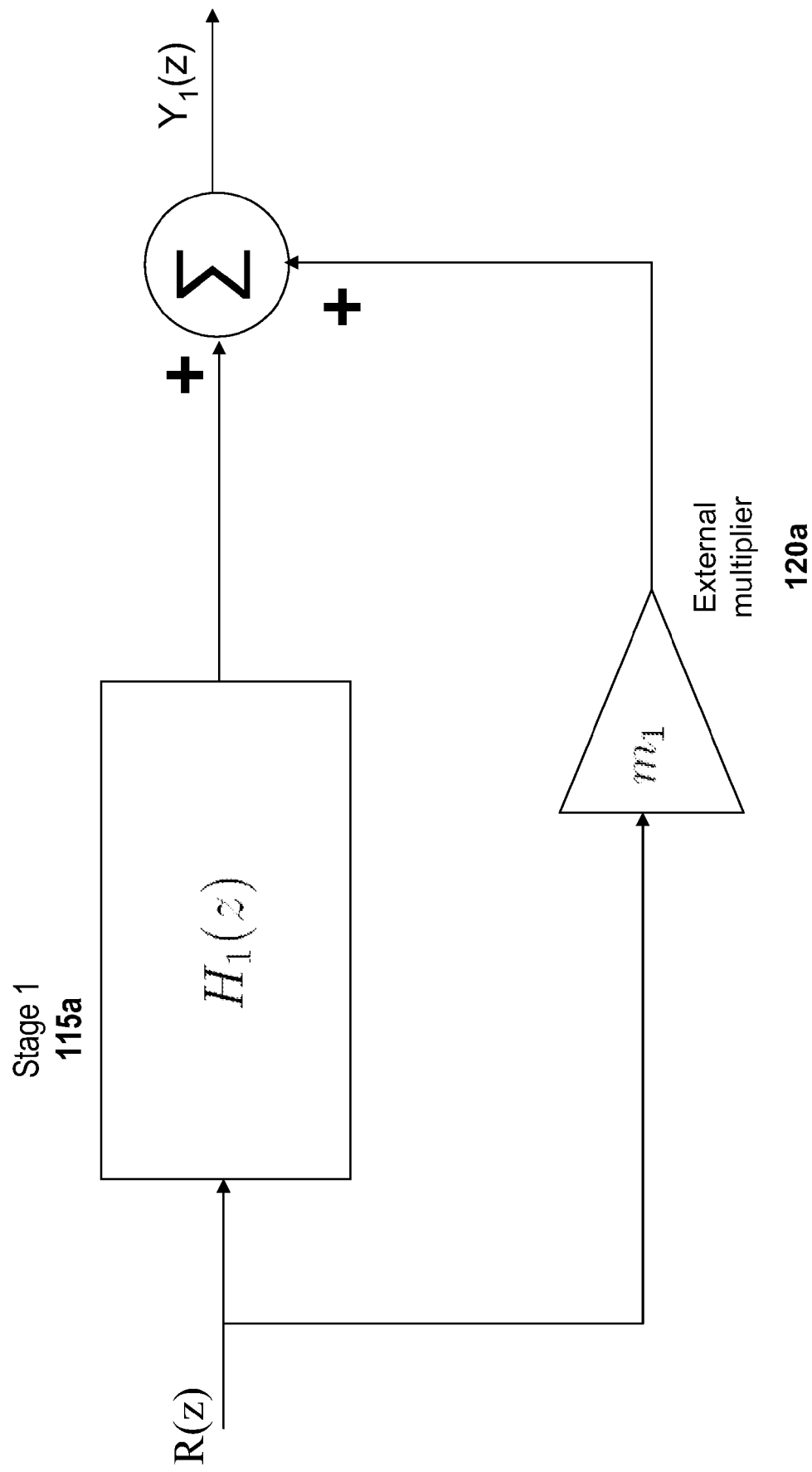
FIG. 4B is an example embodiment of the first stage with an external multiplier connected across it.

Referring now to FIG. 4B, an example embodiment of the first stage 115a with an external multiplier 120a connected across it shown. In one embodiment, the external multiplier 120a may be connected to one or more delay elements and/or other hardware elements. In the example when the expected waveform at the input to the first stage is denoted by R(z)=N+S(z), the output of the first stage 115a is given by:

$$Y_1(z) = N^2 - S^2(z) + m_1[N + S(z)]$$
$$= (N^2 + m_1 N) + S(z)[m_1 - S(z)]$$

Therefore the second stage 115b of the filter 110 in this example is given by:

$$H_2(z) = (N^2 + m_1 N) - S(z)[m_1 - S(z)]$$

Figure 4C:
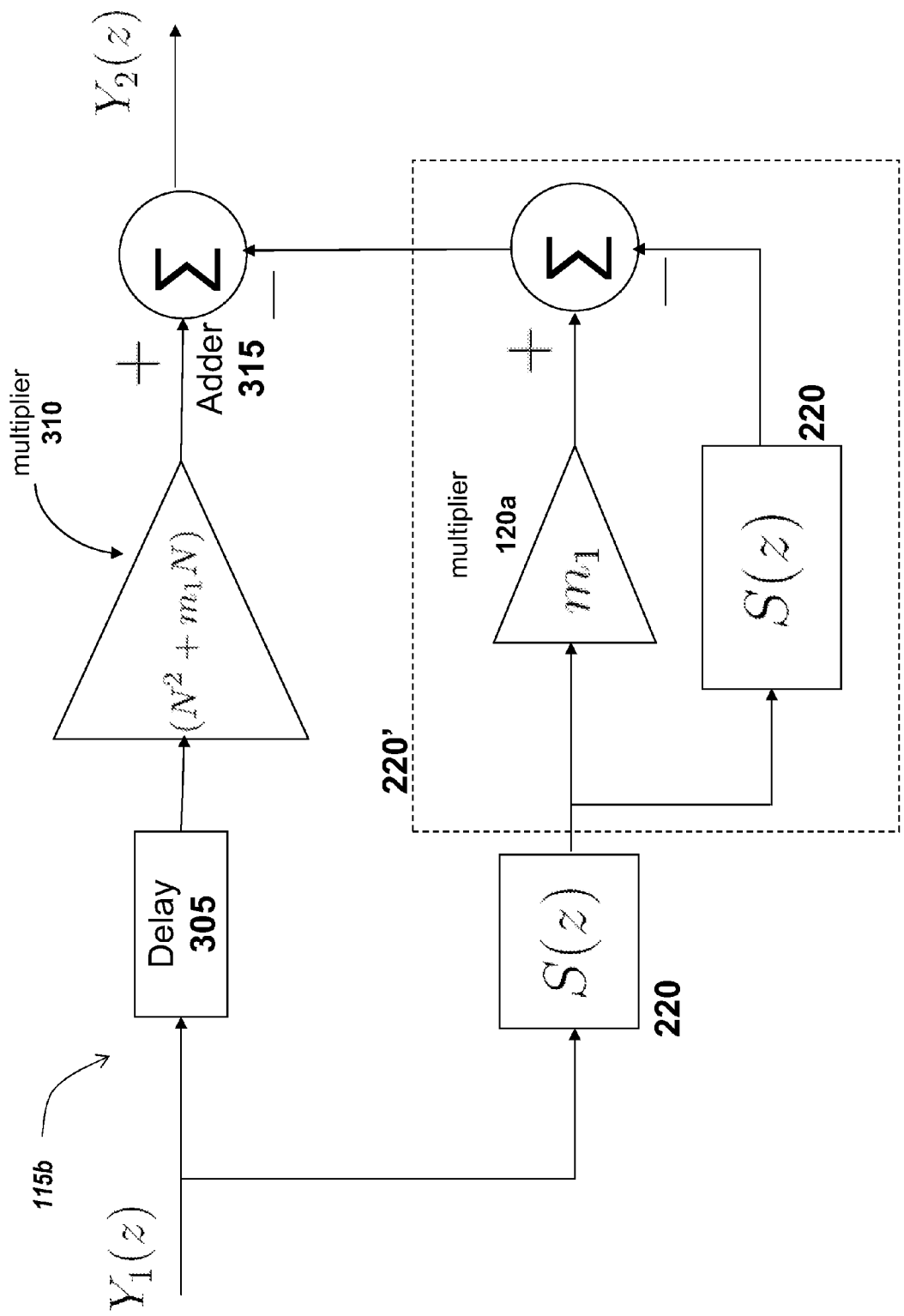
FIG. 4C is an example embodiment of the second stage when an external multiplier is connected across the first stage.

An example embodiment of the modification in the structure of the second stage 115b is shown in FIG. 4C. The output of the second stage 115b will therefore be given by:

$$Y_2(z) = (N^2 + m_1 N)^2 - S^2(z)[m_1 - S(z)]^2$$

Following a substantially similar method as described with respect to FIGS. 3A-3D, one embodiment of the third stage of the sidelobe inversion filter is given by:

$$H_3(z) = (N^2 + m_1 N)^2 + S^2(z)[m_1 - S(z)]^2$$

Figure 4D:
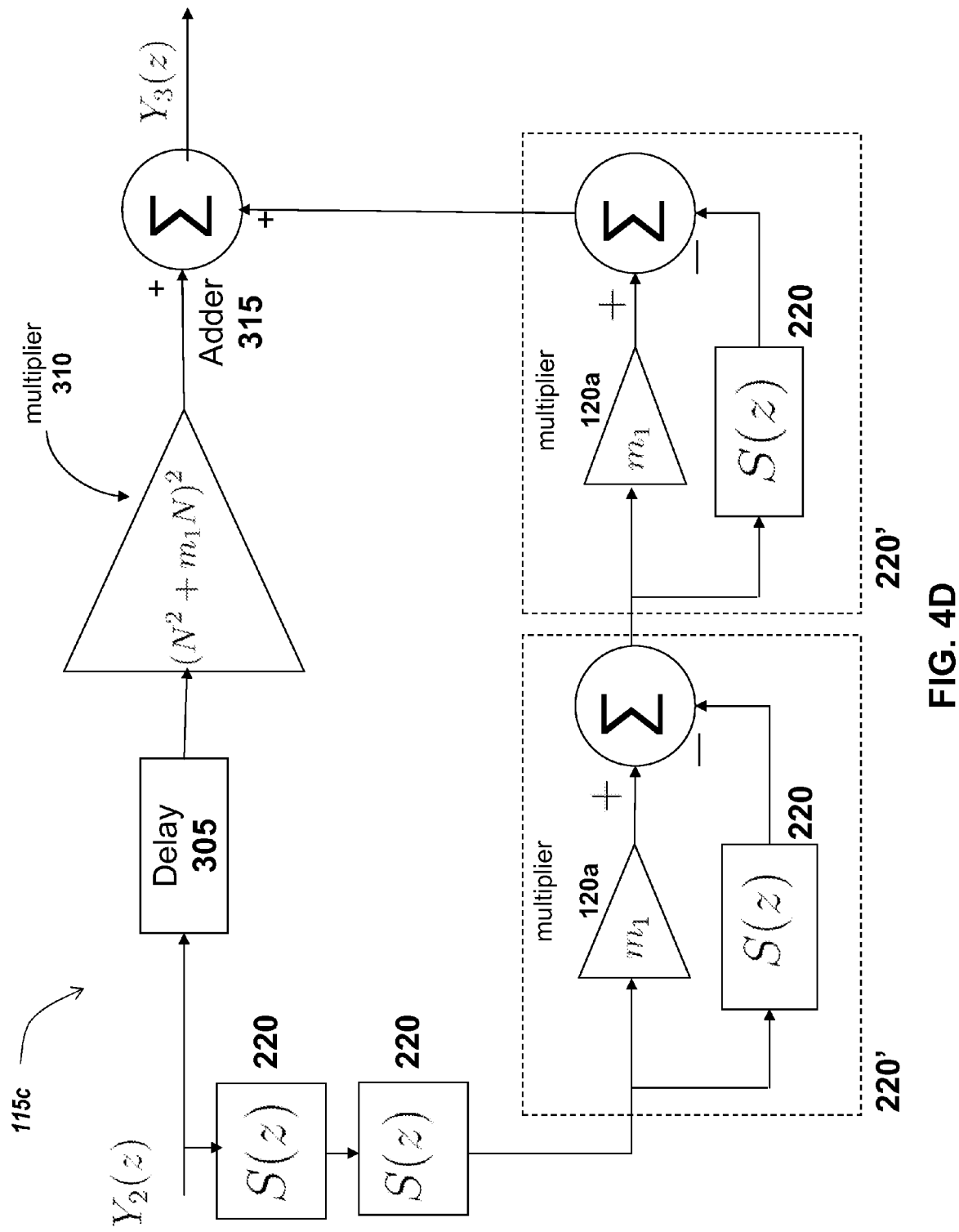
FIG. 4D is an example embodiment of the third stage when an external multiplier is connected across the first stage.

FIG. 4D depicts an embodiment of the filter structure of the third stage 115c. In some embodiments, more stages 115 of the filter 110 may be implemented in cascade.

Filter Performance

Performance of the filter 110 is discussed herein for a Barker code of length 13. Hardware requirements both with and without the external multipliers 120 across one or more stages are shown. It should be noted that these calculations are intended to be purely indicative of the performance and hardware efficiency of an example embodiment of the filter 110 and should not be construed to be limiting in any sense. These calculations may include several assumptions and simplifications.

In one embodiment, the filter 110 requires one multiplier per stage for its implementation. In another embodiment, the number of adders that may be used is a function of the stage 115 for which it is being calculated. In still another embodiment, the number of adders required for the rth stage is given by:

$$A_r = 2^{r-1} \times 3 + 1$$

In one embodiment, one adder in the first stage 115a can be incorporated into the multiplier 210. In this embodiment, the total number of adders for k stages is given by:

$$A(k) = \sum_{r=1}^{k} (2^{r-1} \times 3 + 1) - 1$$

$$= (k-1) + 3 \left( \sum_{r=0}^{k-1} 2^r \right)$$

$$= (k-1) + 3 \times (2^k - 1)$$

$$= 3 \times 2^k - 4 + k$$

The performance of the filter 110 for the Barker code of length 13, with different number of stages is given in table 3. The filter 110 with no external multiplier 120 connected across any stage is denoted as a simple cascaded filter structure.

TABLE 3

Performance of the simple cascaded filter structure with different number of stages for Barker 13

|  | MF | stage 1 | stage 2 | stage 3 | stage 4 | stage 5 |
|---|---|---|---|---|---|---|
| MSR in dB | 22.28 | 23.92 | 29.67 | 35.99 | 45.74 | 62.04 |
| Mul. used in this stage | 0 | 1 | 1 | 1 | 1 | 1 |
| Total mul. used upto this stage | 0 | 1 | 2 | 3 | 4 | 5 |
| Add used in this stage | 12 | 3 | 7 | 18 | 35 | 40 |
| Total add used upto this stage | 12 | 15 | 22 | 35 | 60 | 100 |
| Suppression per mul. (dB) | — | 23.02 | 14.84 | 11.99 | 11.48 | 12.41 |
| Suppression per add (dB) | 1.80 | 1.59 | 1.35 | 1.03 | 0.76 | 0.57 |

The performance of the filter 110 for the Barker code of length 13, with external multipliers 120 connected across the first stage 115a and the last stage 115n is tabulated in table 4. The filter 110 with the external multipliers is denoted as a modified filter. It can be seen that the introduction of the increased number of multipliers significantly improves the performance of the filters. The advantage is evident from the fact that both the suppression per multiplier and the suppression per adder are found to improve in the case of the modified filter.

Comparison with Optimal Filters

Optimal or length-optimal filters for sidelobe suppression are defined to be filters of a given length that achieve the best sidelobe suppression in either a peak sidelobe level (PSL) sense or an integrated sidelobe level (ISL) sense.

Performance of the filter 110 is compared to that of the optimal peak sidelobe (PSL) and optimal integrated sidelobe (ISL) filters. For fixed point arithmetic, the multipliers and adders are considered separately while for floating point implementation, a total number of arithmetic operations as the sum of the number of adders and multipliers is considered. The sidelobe suppression i) per adder, ii) per multiplier (fixed point arithmetic) and iii) per arithmetic operation (floating point arithmetic), are calculated in each case. Table 5 compares the performance of the filters 110 with length-optimal filters reported in the literature that achieve the nearest MSR.

TABLE 4

Performance of the modified filter with different number of stages for Barker 13

|  | MF | stage 1 | stage 2 | stage 3 | stage 4 | stage 5 |
|---|---|---|---|---|---|---|
| MSR in dB | 22.28 | 33.98 | 54.03 | 103.19 | 107.84 | 321.85 |
| Mul. used in this stage | 0 | 2 | 2 | 3 | 5 | 10 |
| Total mul. used upto this stage | 0 | 2 | 5 | 8 | 19 | 28 |
| Add used in this stage | 12 | 4 | 8 | 16 | 30 | 59 |
| Total add used upto this stage | 12 | 10 | 25 | 40 | 71 | 139 |
| Suppression per mul. (dB) | — | 10.00 | 10.81 | 12.80 | 12.91 | 13.09 |
| Suppression per add (dB) | 1.80 | 2.12 | 2.10 | 0.57 | 2.30 | 3.48 |

TABLE 5

Comparison with optimal filters for length 13 Barker code

| Filter | MSR (dB) | Mult. per output | Add per output | Arithmetic operation per output | sidelobe suppression per multiplier (dB) (fixed point) | sidelobe suppression per adder (dB) (fixed point) | sidelobe suppression per arithmetic op. (dB) (floating point) |
|---|---|---|---|---|---|---|---|
| min PSL | 32.50 | 25 | 24 | 49 | 1.3 | 1.35 | 0.66 |
| proposed filter (modified and with 1 stage) | 33.96 | 2 | 16 | 18 | 16.99 | 2.12 | 1.89 |
| min ISL | 58.85 | 65 | 64 | 129 | 0.9 | 0.91 | 0.45 |
| proposed filter (modified and with 2 stages) | 54.03 | 5 | 25 | 30 | 10.31 | 2.16 | 1.80 |
| min PSL | 72.87 | 85 | 84 | 169 | 0.85 | 0.86 | 0.43 |
| proposed filter (modified and with 3 stages) | 103.19 | 8 | 40 | 48 | 12.89 | 2.57 | 2.15 |

From table 5, it can be seen that the length-optimal filters are superior to the filters 110 in terms of suppression per unit filter length but the filters 110 outperform the length-optimal filters in terms of suppression per arithmetic operation as well as per unit chip area in terms of VLSI implementation. In some embodiments, the computational efficiency of the filters 110 is achieved at the expense of a longer filter length as compared to the optimal filters.

Table 6 presents the savings in area achieved by the filters 110 compared to length optimal filters, when implemented in VLSI. In this comparison, it has been assumed that the number of bits for the length-optimal filter coefficients is chosen to satisfy a required precision. The bit-widths of the coefficients of length-optimal filters comparable to the 1 stage, 2 stage and 3 stage versions of the filters 110 have been chosen to be 16, 32 and 47 bits, respectively. In order to facilitate a precise comparison, the area of each filter per dB of suppression achieved has been normalized before calculating the savings. It is also assumed that the ratio of the areas of the proposed and length-optimal filters is not very sensitive to the bit-width of the input data. As observed from table 6, the filters 110 in the example considered achieve significant savings in implementation area compared to the length optimal filters. Furthermore, assuming the average power consumption to be proportional to area×activity, the savings in power consumption, as shown in table 7, approximately follow the area savings. It is pointed out that gate-level power analysis was used to determine the power consumption of the filter 110 and the length-optimal filters.

TABLE 6

Area savings compared to equivalent length optimal filters for Barker 13

| No. of stages of proposed filter | Ratio of area (normalized per dB) | Area savings |
| --- | --- | --- |
| 1 | 0.1195 | 88.04% |
| 2 | 0.0629 | 93.71% |
| 3 | 0.0422 | 95.77% |

TABLE 7

Power savings compared to equivalent length optimal filters for Barker 13

| No. of stages of proposed filter | Ratio of power consumption (normalized per dB) | Power savings |
| --- | --- | --- |
| 1 | 0.1092 | 89.08% |
| 2 | 0.0572 | 94.28% |
| 3 | 0.0389 | 96.11% |

Extension to Compound Codes

If a code $C_{N_1}$ of length $N_1$ is compounded with another code $C_{N_2}$ of length $N_2$, the z-domain representation for such compounding is given by:

$$C_{N_1 \cdot N_2}(z) = C_{N_2}(z) \times C_{N_1}(z^{N_2})$$

where $C_{N_1}$ is the outer code and $C_{N_2}$ is the inner code.

The filter 110 for the compound code can be implemented as a cascade of two filters $M_{N_2}(z)$ and $M_{N_1}(z^{N_2})$ such that:

$$M_{N_1 \cdot N_2}(z) = M_{N_2}(z) \times M_{N_1}(z^{N_2})$$

In some embodiments, one or more of the individual mismatched filters $M_{N_2}(z)$ and $M_{N_1}(z^{N_2})$ may be implemented as filters 110 as described herein. Therefore, the filter 110 for the compound code may be implemented as a cascade of the filters 110 of the component codes. In some embodiments, if additional multipliers are used to optimize the performance of the individual filters, the cascaded implementation may not be optimal for the compound code. However, it can be appreciated that such a cascaded implementation would allow a straightforward extension to a filter for the compound code that would inherit the computational efficiency of the individual filters.

Extension to Polyphase Codes

In some embodiments, the methods and systems herein may be used for polyphase pulse compression codes. Examples of polyphase pulse compression codes include but are not limited to Generalized Barker codes, Frank codes, P1, P2, P3, P4 codes and Chu codes. As an example, filters 110 for Frank codes are described.

Aperiodic Frank codes have good main to peak sidelobe ratio (MSR). They are generated by concatenating the rows of the Discrete Fourier Transform (DFT) matrix of size N×N. In the following example $w = \exp(j2\pi p/N)$ and N and p are relatively prime. This aperiodic code, which is just one period of a periodic code, is of length $N^2$. In some embodiments, the period starts by concatenating the complete set of rows in their natural order as in $$\begin{bmatrix} 1 & 1 & 1 & \cdots & 1 \\ 1 & w & w^2 & \cdots & w^{N-1} \\ 1 & w^2 & w^4 & \cdots & w^{2(N-1)} \\ \vdots & \vdots & \vdots & \ddots & \vdots \\ 1 & w^{N-1} & w^{2(N-1)} & \cdots & w^{(N-1)^2} \end{bmatrix}$$

since this seems to produce the best MSR. The Z transform of this code could be represented by the efficient form given by:

$$X(z) = (1 - z^{-N}) \sum_{r=0}^{N-1} \frac{z^{-rN}}{1 - w^r z^{-1}}$$

The foregoing representation does not require N and p to be relatively prime.

The matched filter for periodic and aperiodic Frank codes may be implemented using the following equation which is combined with appropriate delay elements to render it causal:

$$X^*(z^{-1}) z^{-(N^2-1)} = (z^{-N} - 1) \sum_{r=0}^{N-1} \frac{z^{-(N^2-(r+1)N)}}{z^{-1} - w^{-r}}$$

In one embodiment, N is the size of the DFT matrix. This efficient structure is in IIR form, and its marginally stable poles are canceled by some of its zeros. In some embodiments, due to finite word length effect the cancellation might be inexact. In such a case, two copies of each block should be used with a switching and resetting technique to in effect stabilize pole-zero cancellation.

In one embodiment, if a Frank code is used to produce a pulse compressed waveform, the expected waveform at the input of the filter 110 is given by:

$$R(z) = X(z) X^*(z^{-1})$$

$X^*(z^{-1})$ is the matched filter that depends on the polyphase code. In one embodiment, the operation * denotes complex conjugation. In some embodiments, the system is made causal by adding the appropriate delays. In one embodiment, the autocorrelation function can be expressed as:

$$R(z) = M + S(z)$$

In some embodiments, $M = N^2$ is the length of the code and S(z) represents the sidelobes which are either symmetric in real values or have conjugate symmetry in polyphase codes. In one embodiment, $M=N^2$ represents the desired part of the expected waveform while S(z) denotes the undesired part. In some embodiments, S(z) may be represented as:

$$S(z)=R(z)-M$$

The transfer function of the first stage 115a of the filter 110 is therefore given by:

$$H_1(z)=M-S(z)=2M-R(z)$$

In one embodiment, the output of the first stage 115a may be represented as:

$$Y_1(z)=R(z)\cdot H_1(z)=M^2-[S(z)]^2$$

Following the methods and systems described herein, the second stage 115b of the filter 110 may be represented as:

$$H_2(z)=M^2+[S(z)]^2=M^2+[R(z)-M]^2$$

In this example, the MSR is improved at the output of the second stage 115b. In some embodiments, a multiplier is added across one or more stages 115 to further increase the MSR.

Figure 5A:
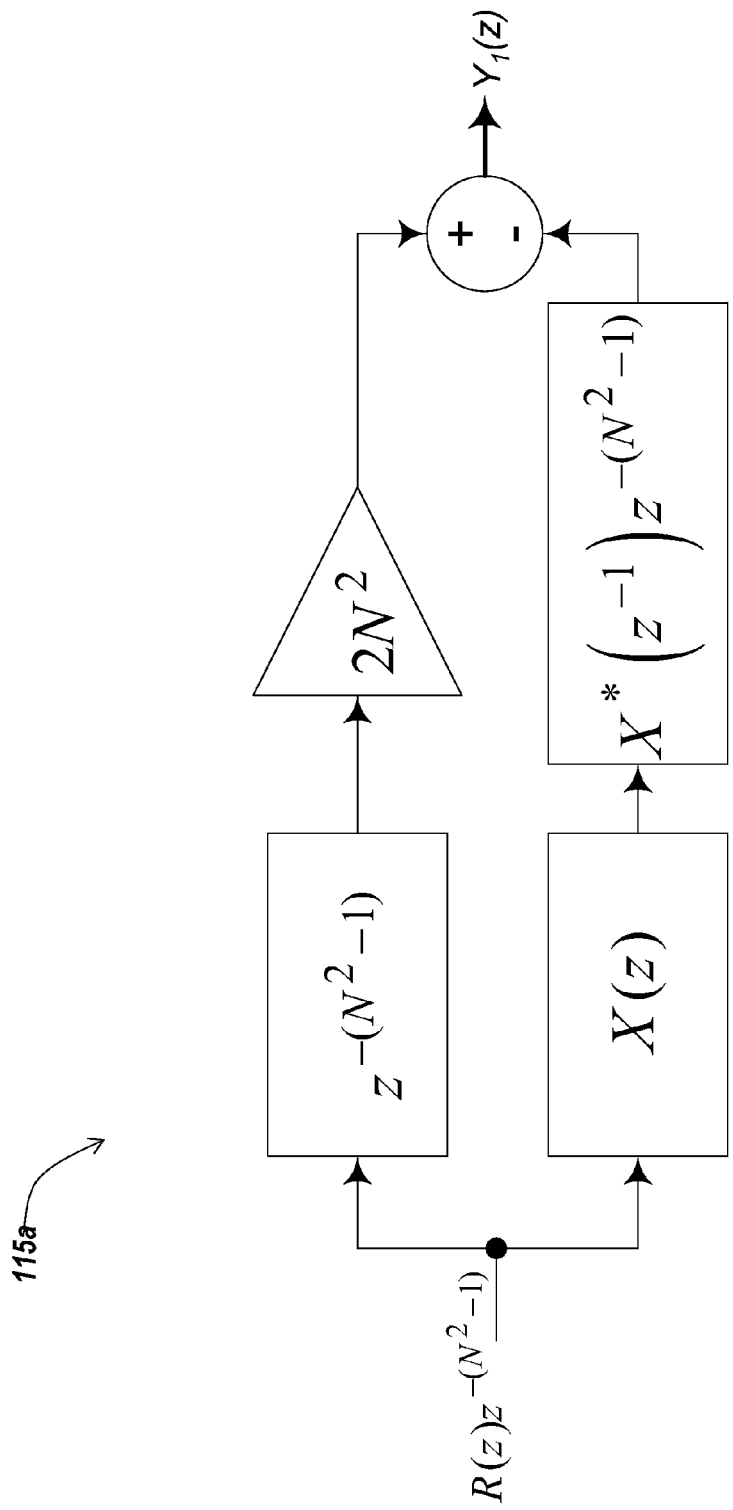
FIG. 5A is an example embodiment of a first stage of the filter for an aperiodic Frank code.

Referring now to FIG. 5A, a first stage 115a of the filter 110 for an aperiodic Frank code is shown and described. The first stage is given as:

$$H_1(z)=2M-R(z)$$

Where R(z), optionally with appropriate delays, is given by:

$$R_d(z) = R(z) \cdot z^{-(N^2-1)}$$
$$= (1-z^{-N})^2 \sum_{r=0}^{N-1} \frac{z^{-(N^2-N)}}{w^r(z^{-1}-w^{-r})^2}$$

Figure 5B:
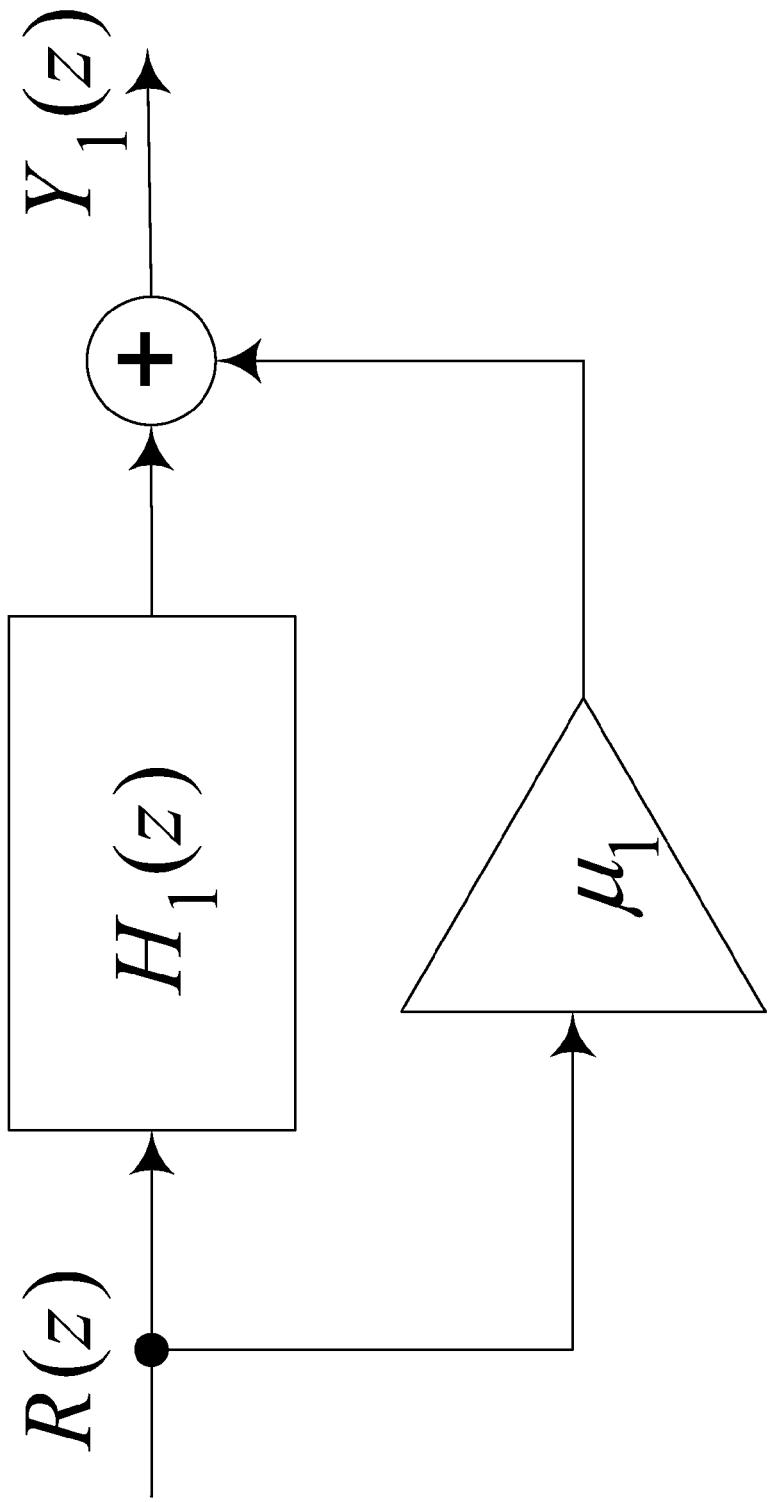
FIG. 5B is an example embodiment of the first stage of the filter for the aperiodic Frank code with an external multiplier $\mu_1$.

Referring now to FIG. 5B, an example embodiment of the first stage 115a with an external multiplier $\mu_1$ is shown. In one embodiment, the output of such a modification of the first stage 115a produces the output:

$$Y_1(z) = [R(z)\cdot H_1(z)] + \mu_1 \cdot R(z)$$
$$= [M^2 - [S(z)]^2] + \mu_1[M + S(z)]$$
$$= [M^2 + \mu_1 M] - [[S(z)]^2 - \mu_1 S(z)]$$

The optimal value of $\mu_1$ is evaluated via computer search. Table 8 shows the optimal value of µ1 to get the maximum MSR at the output of the first stage 115a for codes up to length $N^2=32^2$. The MSR gain is also evaluated.

TABLE 8

| N | MSR R(z) (dB) | MSR $Y_1$(z) (dB) | MSR gain (dB) | $\mu_1$ |
|---|---|---|---|---|
| 3 | 19.0849 | 21.6534 | 2.5686 | 2.8 |
| 4 | 21.0721 | 25.9178 | 4.8457 | 7 |
| 5 | 23.7790 | 27.3273 | 3.5483 | 32.4 |
| 6 | 25.1055 | 29.5782 | 4.4727 | 31.7 |
| 7 | 26.7720 | 30.6548 | 3.8828 | 46.4 |
| 8 | 27.7804 | 32.2027 | 4.4223 | 57 |
| 9 | 28.9837 | 33.0885 | 4.1048 | 76.8 |
| 10 | 29.7996 | 34.1818 | 4.3822 | 90.1 |
| 11 | 30.7413 | 34.9058 | 4.1645 | 113.2 |

TABLE 8-continued

| N | MSR R(z) (dB) | MSR $Y_1$(z) (dB) | MSR gain (dB) | $\mu_1$ |
|---|---|---|---|---|
| 12 | 31.4272 | 35.8073 | 4.3801 | 132.8 |
| 13 | 32.2007 | 36.4136 | 4.2129 | 159.3 |
| 14 | 32.7925 | 37.1308 | 4.3383 | 181.3 |
| 15 | 33.4489 | 37.6816 | 4.2327 | 213.1 |
| 16 | 33.9695 | 38.3190 | 4.3495 | 241.5 |
| 17 | 34.5396 | 38.7777 | 4.2381 | 274.9 |
| 18 | 35.0043 | 39.3142 | 4.3099 | 305.6 |
| 19 | 35.5082 | 39.7588 | 4.2506 | 346.2 |
| 20 | 35.9279 | 40.2408 | 4.3130 | 381.9 |
| 21 | 36.3793 | 40.6212 | 4.2420 | 423.8 |
| 22 | 36.7619 | 41.0519 | 4.2900 | 463.3 |
| 23 | 37.1708 | 41.4245 | 4.2537 | 512.6 |
| 24 | 37.5224 | 41.8084 | 4.2860 | 555.3 |
| 25 | 37.8961 | 42.1355 | 4.2395 | 606 |
| 26 | 38.2213 | 42.4959 | 4.2746 | 654.4 |
| 27 | 38.5654 | 42.8128 | 4.2474 | 711.8 |
| 28 | 38.8679 | 43.1350 | 4.2671 | 762.2 |
| 29 | 39.1867 | 43.4219 | 4.2352 | 821.8 |
| 30 | 39.4695 | 43.7320 | 4.2625 | 879 |
| 31 | 39.7665 | 44.0037 | 4.2372 | 943.4 |
| 32 | 40.0320 | 44.2851 | 4.2530 | 1002.7 |

In one embodiment, further sidelobe suppression can be achieved by using a second filter stages 115b. In one embodiment, the modification of the first stage 115a filter by adding the multiplier $\mu_1$, results in the following modified structure for the second stage 115b:

$$H_2(z) = [M^2 + \mu_1 M] + [S(z)^2 - \mu_1 S(z)]$$
$$= [M^2 + \mu_1 M] + [(R(z) - M)^2 - \mu_1(R(z) - M)]$$

Figure 5C:
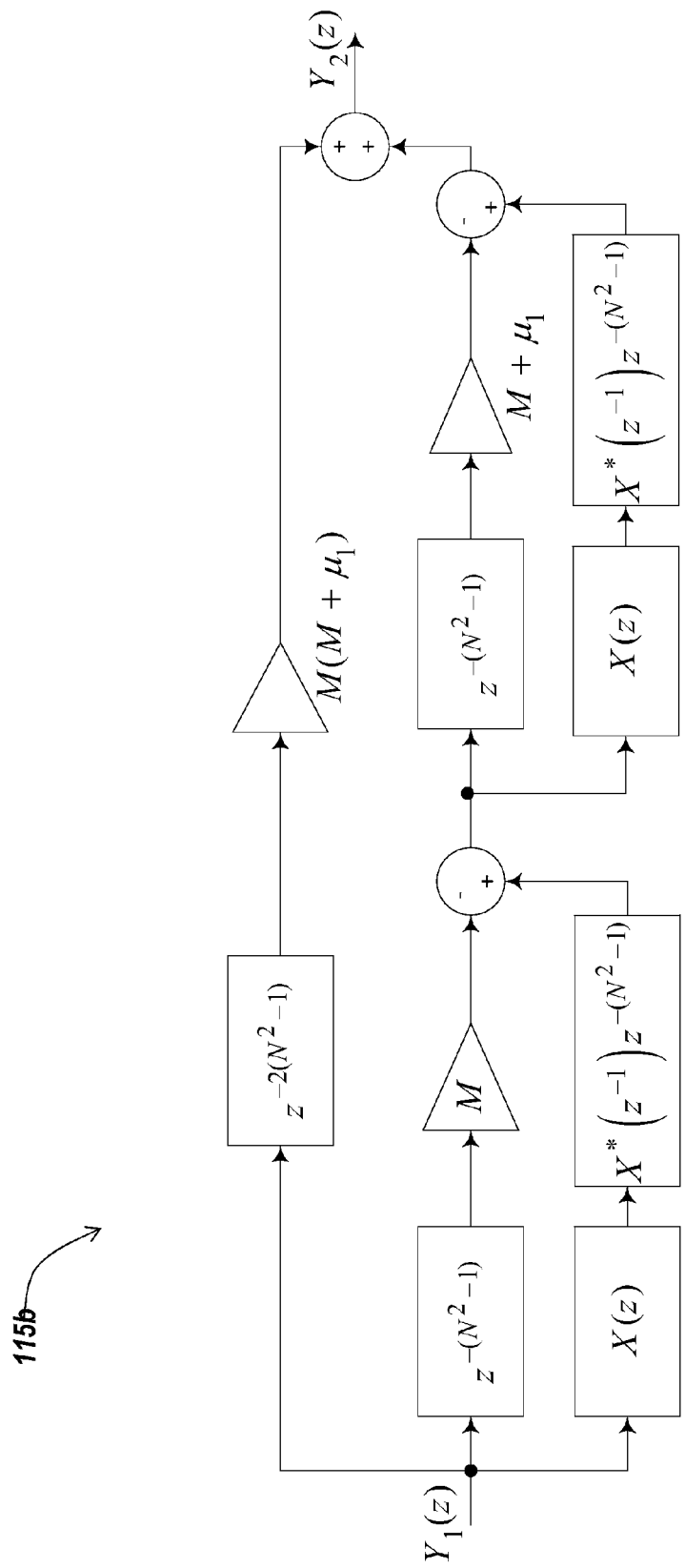
FIG. 5C is an example embodiment of the second stage of the filter for the aperiodic Frank code.
Figure 5D:
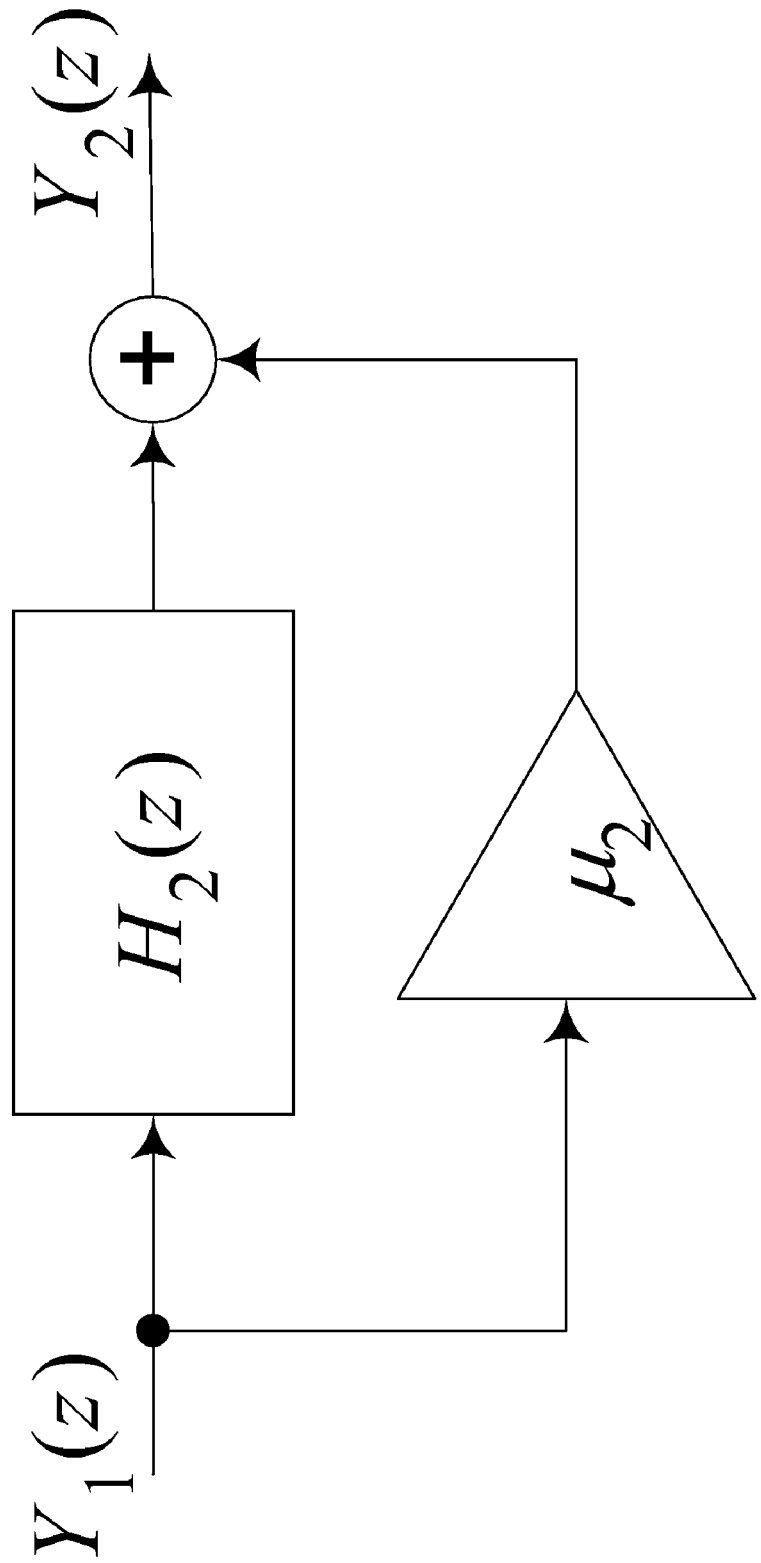
FIG. 5D is an example embodiment of the second stage of the filter for the aperiodic Frank code with the multiplier $\mu_2$.

FIG. 5C depicts an example embodiment of the second stage 115b of the filter 110 for the aperiodic Frank code being discussed herein. In one embodiment, $\mu_1$ is optimized to get the best MSR at the output of the first stage. In another embodiment, the multiplier $\mu_1$ is reoptimized to optimize the MSR at the output of the second stage. In still another embodiment, a second multiplier $\mu_2$ is added across the second stage 115b. In yet another embodiment, one or more of $\mu_1$ and $\mu_2$ are optimized for a best MSR at the output of the second stage 115b. FIG. 5D depicts an example embodiment of the second stage 115b with the multiplier $\mu_2$ across it.

The methods and systems described herein have been described for waveforms and filters related to signals in one dimension. It should be understood that the concepts presented herein may be extended to two or more dimensions without deviating from the scope of the current application.

In view of the structure and functions of the systems and methods described herein, the present solution provides a simple and computationally efficient mismatched filter for suppressing undesired parts in a waveform. Having described certain embodiments of methods and systems for such a filter, it will now become apparent to one of skill in the art that other embodiments incorporating the concepts of the invention may be used. Therefore, the invention should not be limited to certain embodiments, but rather should be limited only by the spirit and scope of the following claims:

What is claimed is:

1. A method for filtering a first signal, the method comprising:

filtering the first signal, by a first discrete filter, to produce a second signal, wherein an impulse response of the first discrete filter is such that a convolution of the impulse response of the first discrete filter with a first discrete waveform produces an autocorrelation of the first discrete waveform, the autocorrelation comprising a first mainlobe and a first set of sidelobes at a first set of positions relative to the first mainlobe; and filtering, via a second discrete filter, the second signal, wherein an impulse response of the second discrete filter comprises a first coefficient substantially equal in value to the first mainlobe amplitude of the autocorrelation and a second set of coefficients at the first set of positions relative to the first coefficient, each of the second set of coefficients substantially equal in value to a negative of a sidelobe at a corresponding position in the autocorrelation, wherein a convolution of the impulse response of the second discrete filter with the autocorrelation produces a second discrete waveform with a second mainlobe and a second set of sidelobes at a second set of positions relative to the second mainlobe.

2. The method of claim 1 wherein the first discrete waveform is a pulse compression code.

3. The method of claim 2 wherein the pulse compression code is one of a biphase code and a polyphase code.

4. The method of claim 2 wherein the pulse compression code is one of a Barker code, a Huffman sequence and a compound Barker code.

5. The method of claim 1 wherein the second discrete filter comprises at least one of a finite impulse response (FIR) filter and an infinite impulse response (IIR) filter.

6. The method of claim 1 further comprising:
filtering an output of the second discrete filter by a third discrete filter, the third discrete filter having an impulse response comprising a third coefficient substantially equal in value to the second mainlobe amplitude and a fourth set of coefficients at the second set of positions relative to the third coefficient, each of the fourth set of coefficients substantially equal in value to a negative of a sidelobe at the corresponding position in the second discrete waveform.

7. A system for filtering a signal, the system comprising:
a first discrete filter having an impulse response such that a convolution of the impulse response of the first discrete filter with a first discrete waveform produces an autocorrelation of the first discrete waveform, the autocorrelation comprising a first mainlobe and a first set of sidelobes at a first set of positions relative to the first mainlobe; and
a second discrete filter, coupled to the output of the first discrete filter, the second discrete filter having an impulse response comprising a first coefficient substantially equal in value to the first mainlobe amplitude and a second set of coefficients at the first set of positions relative to the first coefficient, each of the second set of coefficients substantially equal in value to a negative of a sidelobe at a corresponding position in the autocorrelation, wherein a convolution of the impulse response of the second discrete filter with the autocorrelation produces a second discrete waveform with a second mainlobe and a second set of sidelobes at a second set of positions relative to the second mainlobe.

8. The system of claim 7 further comprising a third discrete filter connected to the second discrete filter, the third discrete filter having an impulse response comprising a third coefficient substantially equal in value to the second mainlobe amplitude and a fourth set of coefficients at the second set of positions relative to the third coefficient, each of the fourth set of coefficients substantially equal in value to a negative of a sidelobe at the corresponding position in the second discrete waveform.

9. The system of claim 8, wherein the second discrete filter and the third discrete filter are implemented without using a multiplier.

10. The system of claim 7 wherein the first discrete waveform is a pulse compression code.

11. The system of claim 10 wherein the pulse compression code is one of a biphase code and a polyphase code.

12. The system of claim 10 wherein the pulse compression code is one of a Barker code, a Huffman sequence and a compound Barker code.

13. The system of claim 7 further comprising one or more external multipliers connected between the input and output of the second discrete filter.

14. The system of claim 7, wherein the first discrete filter and the second discrete filter are implemented on an integrated circuit.

15. The system of claim 7, wherein the first discrete filter and the second discrete filter are implemented on one of a programmable chip, a charge coupled device and a charge transfer device.

16. The system of claim 7, wherein the signal is received from an imaging system.

17. The system of claim 7, wherein the imaging system is one of a magnetic resonance imaging system and a computerized axial tomography imaging system.

18. The system of claim 7, wherein the signal is received from a radar system.

19. The system of claim 7, wherein the second discrete filter is implemented without using a multiplier.

* * * * *